United States Patent
Im et al.

(10) Patent No.: US 9,991,424 B2
(45) Date of Patent: Jun. 5, 2018

(54) LIGHT-EMITTING DIODE AND METHOD FOR MANUFACTURING SAME

(71) Applicant: Seoul Viosys Co., Ltd., Ansan-si (KR)

(72) Inventors: Tae Hyuk Im, Ansan-si (KR); Chang Yeon Kim, Ansan-si (KR); Yeo Jin Yoon, Ansan-si (KR); Joon Hee Lee, Ansan-si (KR); Ki Bum Nam, Ansan-si (KR); Da Hye Kim, Ansan-si (KR); Chang Ik Im, Ansan-si (KR); Young Wug Kim, Ansan-si (KR)

(73) Assignee: Seoul Viosys Co., Ltd., Ansan-si (KR)

( * ) Notice: Subject to any disclaimer, the term of this patent is extended or adjusted under 35 U.S.C. 154(b) by 0 days. days.

(21) Appl. No.: 15/355,219

(22) Filed: Nov. 18, 2016

(65) Prior Publication Data

US 2017/0069799 A1     Mar. 9, 2017

Related U.S. Application Data

(63) Continuation of application No. 14/980,937, filed on Dec. 28, 2015, now Pat. No. 9,508,909, which is a
(Continued)

(30) Foreign Application Priority Data

Dec. 23, 2011 (KR) .......... 10-2011-0141449
Feb. 28, 2012 (KR) .......... 10-2012-0020540
(Continued)

(51) Int. Cl.
    *H01L 31/12*     (2006.01)
    *H01L 33/44*     (2010.01)
(Continued)

(52) U.S. Cl.
    CPC .......... *H01L 33/44* (2013.01); *H01L 33/0008* (2013.01); *H01L 33/0079* (2013.01);
(Continued)

(58) Field of Classification Search
    CPC .. H01L 27/288; H01L 31/143; H01L 51/0032
    See application file for complete search history.

(56) References Cited

U.S. PATENT DOCUMENTS 6,657,236 B1    12/2003    Thebeault et al.
7,573,074 B2    8/2009    Shum et al.
(Continued)

FOREIGN PATENT DOCUMENTS

CN     101740677     6/2010
JP     2002-231647     8/2002
(Continued)

OTHER PUBLICATIONS

International Search Report dated Apr. 24, 2013 in International Patent Application No. PCT/KR2012/011257.
(Continued)

*Primary Examiner* — Elias M Ullah
(74) *Attorney, Agent, or Firm* — H.C. Park & Associates, PLC

(57) ABSTRACT

A light-emitting diode including a support substrate, a semiconductor stack disposed on the support substrate and including a p-type compound semiconductor layer, an active layer, and an n-type compound semiconductor layer, a reflective metal layer disposed between the support substrate and the semiconductor stack, the reflective metal layer being in ohmic contact with the p-type compound semiconductor layer of the semiconductor stack and including a groove exposing a portion of the semiconductor stack, an insulation layer disposed between the support substrate and the semiconductor stack and disposed in the groove, and a first
(Continued)

electrode including a first electrode pad and a first electrode extension and contacting the n-type compound semiconductor layer of the semiconductor stack, in which the first electrode extension is connected to the first electrode pad, and the first electrode extension is formed along an outer boundary of the light-emitting diode.

17 Claims, 26 Drawing Sheets

Related U.S. Application Data continuation of application No. 14/368,268, filed as application No. PCT/KR2012/011257 on Dec. 21, 2012, now Pat. No. 9,236,533.

(30) Foreign Application Priority Data

| | | |
|---|---|---|
| Mar. 8, 2012 | (KR) | 10-2012-0023822 |
| Mar. 9, 2012 | (KR) | 10-2012-0024687 |

(51) Int. Cl.

| | |
|---|---|
| *H01L 33/22* | (2010.01) |
| *H01L 33/00* | (2010.01) |
| *H01L 33/20* | (2010.01) |
| *H01L 33/38* | (2010.01) |
| *H01L 33/32* | (2010.01) |
| *H01L 33/06* | (2010.01) |
| *H01L 33/60* | (2010.01) |
| *H01L 33/40* | (2010.01) |

(52) U.S. Cl.
CPC .............. *H01L 33/06* (2013.01); *H01L 33/20* (2013.01); *H01L 33/22* (2013.01); *H01L 33/32* (2013.01); *H01L 33/38* (2013.01); *H01L 33/387* (2013.01); *H01L 33/405* (2013.01); *H01L 33/60* (2013.01); *H01L 2933/0083* (2013.01); *H01L 2933/0091* (2013.01)

(56) References Cited

U.S. PATENT DOCUMENTS

| | | | |
|---|---|---|---|
| 9,029,888 B2 * | 5/2015 | Kim | H01L 33/38 257/98 |
| 2005/0145873 A1 | 7/2005 | Pan et al. | |
| 2006/0118802 A1 | 6/2006 | Lee et al. | |
| 2006/0118803 A1 | 6/2006 | Lee et al. | |
| 2007/0145386 A1 | 6/2007 | Lee et al. | |
| 2010/0123118 A1 | 5/2010 | Hu et al. | |
| 2011/0133242 A1 * | 6/2011 | Choi | H01L 33/38 257/99 |
| 2011/0272720 A1 | 11/2011 | Gardner et al. | |

FOREIGN PATENT DOCUMENTS

| | | |
|---|---|---|
| JP | 2011243956 | 12/2011 |
| KR | 10-0682872 | 2/2007 |
| KR | 10-2007-0081934 | 8/2007 |
| KR | 10-2008-0058722 | 6/2008 |
| KR | 10-2008-0082326 | 9/2008 |
| KR | 1020090060216 | 6/2009 |
| KR | 1020110133240 | 12/2011 |

OTHER PUBLICATIONS

Non-Final Office Action dated Jul. 6, 2015 in U.S. Appl. No. 14/363,268.
Notice of Allowance dated Sep. 2, 2015 in U.S. Appl. No. 14/363,263.
Notice of Allowance dated Jul. 13, 2016 in U.S. Appl. No. 14/980,937.
Office Action dated Jan. 22, 2018, in Korean Patent Application No. 10-2012-0023822.
Office Action dated Dec. 20, 2017, in Korean Patent Application No. 10-2011-0141449.

\* cited by examiner

LIGHT-EMITTING DIODE AND METHOD FOR MANUFACTURING SAME

CROSS-REFERENCE TO RELATED APPLICATIONS

This application is a continuation of U.S. patent application Ser. No. 14/980,937, filed on Dec. 28, 2015, which is a continuation of U.S. patent application Ser. No. 14/368,268, filed on Jun. 23, 2014, now issued as U.S. Pat. No. 9,236,533, which is the National Stage of International Application No. PCT/KR2012/011257, filed on Dec. 21, 2012, and claims priority from and the benefit of Korean Patent Application No. 10-2011-0141449, filed on Dec. 23, 2011, Korean Patent Application No. 10-2012-0020540, filed on Feb. 28, 2012, Korean Patent Application No. 10-2012-0023822, filed on Mar. 8, 2012, and Korean Patent Application No. 10-2012-0024687, filed on Mar. 9, 2012, which are all hereby incorporated by reference for all purposes as if fully set forth herein.

BACKGROUND

Field

The present invention relates to a light emitting diode and a method of manufacturing the same and, more particularly, to a light emitting diode having improved light extraction efficiency and a method of manufacturing the same.

Discussion of the Background

Generally, group-III nitrides such as gallium nitride (GaN) have excellent thermal stability and direct transition type energy band structure, and thus have attracted attention as materials for light emitting devices for emitting light in visible and ultraviolet bands. In particular, blue and green light emitting devices using indium gallium nitride (InGaN) have been used in a wide application range, such as large natural color flat displays, signal lamps, indoor lighting, high flux light sources, high resolution output systems, optical communications, and the like.

A light emitting diode includes an n-type semiconductor layer, a p-type semiconductor layer and an active layer interposed between the n-type and p-type semiconductor layers, and emits light through recombination of electrons and holes injected into the active layer upon application of forward bias to the n-type and p-type semiconductor layers.

Since it is difficult to produce a homogeneous substrate capable of growing gallium nitride layers, a group-III nitride semiconductor layer is generally grown on a heterogeneous substrate having a similar crystal structure to the gallium nitride layers through metal-organic chemical vapor deposition (MOCVD) or molecular beam epitaxy (MBE). As for the heterogeneous substrate, a sapphire substrate having a hexagonal crystal system is generally used.

However, an epitaxial layer grown on the heterogeneous substrate has a relatively high dislocation density due to lattice mismatch and difference in thermal expansion coefficient between the epitaxial layer and the growth substrate, thereby providing a limit in improvement in luminous efficacy of the light emitting diode.

Accordingly, studies have been made to develop a novel technology capable of producing a gallium nitride-based light emitting diode using a gallium nitride substrate as a growth substrate. Since the gallium nitride substrate is a homogeneous substrate with respect to epitaxial layers grown thereon, the gallium nitride substrate can improve luminous efficacy of the light emitting diode by reducing crystal defects in the epitaxial layers.

For a conventional sapphire substrate, a certain pattern is formed on the growth substrate as in a patterned sapphire substrate (PSS) to enhance light extraction efficiency of the light emitting diode. However, since the gallium nitride substrate is formed of the same kind of material as that of the epitaxial layer grown thereon, the epitaxial layer and the substrate have substantially the same index of refraction. Thus, even if the pattern is formed on the gallium nitride substrate, since there is no difference in index of refraction between the substrate and the epitaxial layer, the pattern does not cause scattering or refraction of light. Thus, light generated in an active layer reaches a bottom surface of the substrate through the gallium nitride substrate having a relatively high thickness of about 300 μm, thereby causing substantial loss of light in the gallium nitride substrate.

In addition, since the sapphire substrate is electrically non-conductive, the sapphire substrate restricts the structure of the light emitting diode. In recent years, various attempts have been made to develop a technology of manufacturing a vertical type light emitting diode by growing epitaxial layers such as nitride semiconductor layers on a heterogeneous substrate, for example, a sapphire substrate, bonding a support substrate to the epitaxial layers, and separating the heterogeneous substrate from the epitaxial layers by laser lift-off or the like.

Generally, as compared with a typical lateral type light emitting diode in the art, the vertical type light emitting diode includes a p-type semiconductor at a lower portion thereof to secure excellent current spreading performance, and employs a support substrate having higher thermal conductivity than the sapphire substrate to provide excellent heat dissipation.

In addition, an n-type semiconductor layer disposed at an upper portion of the vertical type light emitting diode may be subjected to anisotropic etching such as photo-enhanced chemical (PEC) etching and the like to form a roughened surface on the n-type semiconductor layer, thereby significantly improving light extraction efficiency.

However, in such a vertical type light emitting diode, since the overall thickness (about 4 μm) of the epitaxial layers is very thin as compared with a light emitting area of, for example, 350 μm×350 μm, or 1 mm2, there is severe difficulty in current spreading.

To address such problems, an electrode extension extending from an n-type electrode pad is formed to allow current spreading within the n-type semiconductor layer, or an insulation material is disposed on a p-type electrode at a place corresponding to the n-type electrode pad to prevent direct flow of electric current from the n-type electrode pad to the p-type electrode.

However, these structures also have a limit in prevention of current crowding under the n-type electrode pad and cannot achieve uniform spreading of electric current over a wide light emitting area.

SUMMARY

The present invention is aimed at providing a light emitting diode having improved light extraction efficiency.

In addition, the present invention is aimed at providing a light emitting diode which has reduced dislocation density to allow high current operation.

Further, the present invention is aimed at providing a light emitting diode which can reduce forward voltage.

Further, the present invention is aimed at providing a light emitting diode having improved current spreading.

In accordance with one aspect of the present invention, a method of manufacturing a light emitting diode includes: forming a light emitting diode structure including a first conductive type clad layer, a second conductive type clad layer, and an active layer disposed between the clad layers; and forming a plurality of grooves within a surface of the first conductive type clad layer by forming defects within the surface of the first conductive type clad layer and etching the defects.

Formation of the defects within the surface of the first conductive type clad layer may include implanting impurities into the surface of the first conductive type clad layer. The impurities may include first conductive type dopants. Formation of the plurality of grooves may be performed by wet etching. Wet etching may be photo-enhanced chemical etching.

When forming the defects within the surface of the first conductive type clad layer, the defects may be formed to have a gradually increasing depth from a central portion of the surface of the first conductive type clad layer towards an outer periphery thereof. The defects may be formed by implantation of impurities, and Rp (Projected Range) of the implanted impurities may be deepened from the central portion of the surface of the first conductive type clad layer towards the outer periphery thereof. To this end, before implantation of the impurities, a mask layer may be formed on the surface of the first conductive type clad layer to have a gradually decreasing thickness from the central portion of the surface of the first conductive type clad layer towards the outer periphery thereof.

Formation of the first conductive type clad layer may include forming a main first conductive type clad layer, forming an intrinsic clad layer on the main first conductive type clad layer, and forming an assistant first conductive type clad layer on the intrinsic clad layer. The grooves may be formed within the assistant first conductive type clad layer. At least some bottoms of the grooves may adjoin the intrinsic clad layer.

The first conductive type clad layer, the active layer, and the second conductive type clad layer may be sequentially formed on a growth substrate, and the surface of the first conductive type clad layer may be exposed by removing the growth substrate before formation of the defects. The growth substrate may be a GaN substrate and the first conductive type clad layer may be a GaN layer.

In accordance with another aspect of the present invention, a light emitting diode includes a first conductive type clad layer having a plurality of grooves formed by etching defects within a surface thereof, and a second conductive type clad layer. An active layer is disposed between the clad layers. Bottom levels of the grooves may be lowered from a central portion of a surface of the first conductive type clad layer towards an outer periphery thereof.

In accordance with a further aspect of the present invention, a light emitting diode includes: a first conductive type clad layer having a plurality of grooves and a plurality of protrusions defined by the grooves within a surface thereof, and a second conductive type clad layer. The protrusions have a higher impurity concentration than the first conductive type clad layer. An active layer is disposed between the clad layers.

In accordance with yet another aspect of the present invention, a light emitting diode includes a first conductive type clad layer. The first conductive type clad layer has a light scattering pattern having a different index of refraction than the first conductive type clad layer. An active layer is disposed under the first conductive type clad layer. A second conductive type clad layer is disposed under the active layer. A first electrode is disposed on the first conductive type clad layer and electrically connected thereto. A second electrode is disposed under the second conductive type clad layer and electrically connected thereto.

The light scattering pattern may overlap the first electrode. The light scattering pattern may be restrictively disposed in a region overlapping the first electrode and a region adjacent thereto. The first electrode may include a bonding pad and an extension, and the light scattering pattern may be disposed under the bonding pad without being disposed under the extension.

Openings defined by the light scattering pattern may have a smaller width in the region overlapping the first electrode than in a region not overlapping the first electrode.

In accordance with yet another aspect of the present invention, a method of manufacturing a light emitting diode includes forming a light scattering pattern on a lower first conductive type clad layer. The light scattering pattern has a different index of refraction than the lower first conductive type clad layer. An upper first conductive type clad layer is formed on the light scattering pattern. An active layer is formed on the upper first conductive type clad layer. A second conductive type clad layer is formed on the active layer. An electrode is formed on the lower first conductive type clad layer and electrically connected thereto.

The lower first conductive type clad layer may be formed on a growth substrate. In this case, before the electrode is formed, the growth substrate may be removed to expose the lower first conductive type clad layer. Here, the growth substrate may be a GaN substrate and the first conductive type clad layer may be a GaN layer.

In accordance with yet another aspect of the present invention, a light emitting diode includes a gallium nitride substrate; a first gallium nitride-based contact layer disposed on the gallium nitride substrate; a second gallium nitride-based contact layer disposed above the first contact layer; an active layer disposed between the first contact layer and the second contact layer and having a multi-quantum well layer structure; and a pattern of a dielectric material disposed between the gallium nitride substrate and the first contact layer. The dielectric material has a different index of refraction than the gallium nitride substrate.

The dielectric material may have a lower index of refraction than the gallium nitride substrate and may be formed of $SiO_2$ or $Si_3N_4$. In addition, the pattern of the dielectric material may include a stripe pattern, an island pattern, or a mesh pattern. The pattern of the dielectric material may have a flat surface on an upper surface thereof. Alternatively, the pattern of the dielectric material may have a convexly hemispherical shape.

The light emitting diode may further include a super-lattice layer of a multilayer structure disposed between the first contact layer and the active layer.

In some embodiments, the super-lattice layer of the multilayer structure may have a structure in which an InGaN layer, an AlGaN layer and a GaN layer are repeatedly stacked one above another in plural times. The super-lattice layer of the multilayer structure may further include a GaN layer between the InGaN layer and the AlGaN layer in each cycle.

In some embodiments, the active layer of the multi-quantum well structure may include a plurality of (n−1) barrier layers between a first well layer disposed nearest the n-type contact layer and an n-th well layer disposed nearest the p-type contact layer, wherein, among the plurality of (n−1) barrier layers, barrier layers having higher thicknesses than an average thickness of the (n−1) barrier layers may be disposed closer to the first well layer, and barrier layers having lower thicknesses than the average thickness of the (n−1) barrier layers may be disposed closer to the n-th well layer. Further, the number of barrier layers having higher thicknesses than the average thickness is greater than the number of barrier layers having lower thicknesses than the average thickness.

The barrier layers in the active layer may be formed of AlGaN or AlInGaN. In addition, the barrier layers may have an Al content ratio of greater than 0 to less than 0.1. Preferably, the barrier layers have an Al content ratio of 0.01 or more, more preferably 0.02 or more, and preferably 0.05 or less.

In some embodiments, the light emitting diode may further include a lower GaN layer disposed between the substrate and the n-type contact layer, and an intermediate layer disposed between the n-type contact layer and the lower GaN layer. Here, the intermediate layer may be formed of AlInN or AlGaN. The pattern of the dielectric material may be disposed between the gallium nitride substrate and the lower GaN layer.

In accordance with yet another aspect of the present invention, a light emitting diode includes: a support substrate; a semiconductor stack structure disposed on the support substrate and including a p-type compound semiconductor layer, an active layer and an n-type compound semiconductor layer; a reflective metal layer disposed between the support substrate and the semiconductor stack structure to form ohmic contact with the p-type compound semiconductor layer of the semiconductor stack structure and having a groove through which the semiconductor stack structure is exposed; a first electrode pad disposed on the n-type compound semiconductor layer of the semiconductor stack structure; an electrode extension extending from the first electrode pad and disposed on a region of the groove; and an upper insulation layer interposed between the first electrode pad and the semiconductor stack structure, wherein the electrode extension includes a Ni layer contacting the n-type compound semiconductor layer, and at least two Au layers on the Ni layer.

The light emitting diode may further include a Cr layer acting as a deformation relieving layer between the two Au layers.

The electrode extension may include a Ni layer/Al layer/Ni layer/Au layer/Cr layer/Au layer.

Each of the Au layers may have a thickness of 1 µm to 5 µm.

The n-type compound semiconductor layer may include an n-type contact layer, and a first recovery layer disposed between the n-type contact layer and the active layer and adjoining the n-type contact layer. Here, the first recovery layer may be an undoped layer or a lightly doped layer having a lower doping concentration than the doping concentration of the n-type contact layer and the n-type contact layer may have a thickness of 4.5 µm to 10 µm.

The first recovery layer may have a thickness of 100 nm to 200 nm.

The light emitting diode may further include an electron injection layer interposed between the first recovery layer and the active layer.

The light emitting diode may further include a superlattice layer interposed between the electron injection layer and the active layer.

The light emitting diode may further include an electron replenishment layer interposed between the first recovery layer and the second recovery layer.

The light emitting diode may further include an intermediate insulation layer adjoining a surface of the semiconductor stack structure exposed through the groove of the reflective metal layer.

The light emitting diode may further include a barrier metal layer disposed between the reflective metal layer and the support substrate and covering the reflective metal layer.

The reflective metal layer may be composed of a plurality of plates.

The semiconductor stack structure may have a roughened surface, and the upper insulation layer may cover the roughened surface while forming a convex-concave surface along the roughened surface.

The semiconductor stack structure may have a flat surface and the first electrode pad and the electrode extension may be disposed on the flat surface.

The electrode extension may contact the flat surface of the semiconductor stack structure.

According to embodiments of the present invention, in the light emitting diode, grooves and protrusions defined by the grooves, that is, roughness, provide a high possibility of allowing photons to escape from an active layer. As a result, the light emitting diode has improved light extraction efficiency.

At least some bottoms of the grooves may adjoin an intrinsic clad layer. This structure can prevent the grooves from reaching a light emitting layer due to excessive etching, thereby preventing deterioration in device efficiency.

On the other hand, when the grooves are formed by implanting a first conductive dopant into a surface of a first conductive type clad layer, the concentration of the first conductive type dopant may increase in the protrusions remaining after etching for formation of the grooves. In this case, improved ohmic contact can be formed between a first electrode connected to the first conductive type clad layer and the protrusions.

When defects are formed to have a gradually increasing depth from a central portion of the surface of the first conductive type clad layer towards an outer periphery thereof, bottom levels of the grooves are lowered from the central portion of the surface of the first conductive type clad layer towards the outer periphery thereof. In this case, an upper surface of the light emitting diode may have an inclination from the central portion thereof towards the outer periphery thereof. With this structure, the light emitting diode has improved light spreading and is suitable for lighting.

When the growth substrate is a GaN substrate and the first conductive type clad layer is a GaN layer, few defects can be formed in the first conductive type clad layer. Thus, in order to form the grooves by etching the defects within the surface of the first conductive type clad layer, it is advantageous to form additional defects as described above.

In addition, according to the present invention, a light scattering pattern may be formed within the first conductive type clad layer to scatter light generated from the active layer, thereby improving light extraction efficiency. The light scattering pattern may be disposed in a region overlapping the first electrode. In this case, light emitted from a region of the active layer disposed perpendicularly below the first electrode is scattered by the light scattering pattern to be emitted towards a region in which the first electrode is not formed. As a result, the light emitting diode can have further improved light extraction efficiency.

Further, openings defined by the light scattering pattern may have a smaller width in a region overlapping the first electrode than in a region that does not overlap the first electrode. As a result, current crowding can be relieved in the region overlapping the first electrode, thereby improving lateral current spreading in the light emitting structure. In addition, the light scattering pattern may be restrictively disposed in the region overlapping the first electrode and a region adjacent thereto. In this case, current flow can be further secured in the region not overlapping the first electrode than in the region overlapping the first electrode. Accordingly, lateral current spreading can be further improved in the light emitting structure.

Further, when the growth substrate is a GaN substrate and the first conductive type clad layer is a GaN layer, the light emitting structure including the first conductive type clad layer may be formed of high quality epitaxial layers with very few crystal defects.

On the other hand, light is refracted or scattered by a pattern of a dielectric material disposed between the gallium nitride substrate and the first contact layer, whereby the light emitting diode can reduce light loss due to the gallium nitride substrate while enhancing light extraction efficiency. Further, a super-lattice layer is disposed between the first contact layer and the active layer to prevent generation of crystal defects within the active layer. With this structure, the light emitting diode can have significantly improved luminous efficacy and reduce dislocation density to be driven at high current.

Further, with the stack structure of the super-lattice layer in which InGaN layers, AlGaN layers and GaN layers are repeatedly stacked one above another in plural times, it is possible to confine holes within the active layer while allowing efficient supply of electrons into the active layer. As a result, the light emitting diode can have improved luminous efficacy without increasing operation voltage.

Furthermore, relatively thin barrier layers are disposed near a p-type contact layer, thereby enabling reduction in forward voltage without deteriorating luminous efficacy.

Furthermore, the light emitting diode includes an intermediate layer, thereby further reducing crystal defects in the light emitting diode.

Furthermore, a light emitting diode having improved current spreading performance is provided.

It should be understood that the present invention is not limited to the above advantageous effects, and other advantageous effects will become apparent to those skilled in the art from the following description.

BRIEF DESCRIPTION OF THE DRAWINGS

The accompanying drawings, which are included to provide a further understanding of the invention and are incorporated in and constitute a part of this specification, illustrate embodiments of the invention, and together with the description serve to explain the principles of the invention.

FIGS. 25a, 25b, 26, 27, 28 and 29 are sectional views illustrating a method of manufacturing the light emitting diode according to the embodiment of the present invention, each taken along line A-A of FIG. 21, in which FIG. 25a is a sectional view of the light emitting diode after growth of semiconductor layers on a substrate and FIG. 25b is an enlarged sectional view of the semiconductor layers.

DETAILED DESCRIPTION OF THE ILLUSTRATED EMBODIMENTS

Figure 1A:
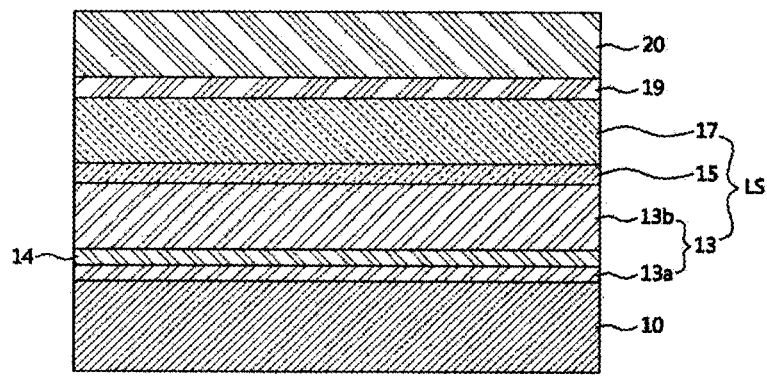
FIGS. 1a, 1b, 1c, 1d, and 1e are sectional views illustrating a method of manufacturing a light emitting diode according to one embodiment of the present invention.

Hereinafter, embodiments of the present invention will be described in more detail with reference to the accompanying drawings. It should be understood that the following embodiments are given by way of illustration only to provide a thorough understanding of the invention to those skilled in the art. Therefore, the present invention is not limited to the following embodiments and may be embodied in different ways.

Herein, it will be understood that, when a layer is referred to as being "on" another layer or substrate, it can be directly formed on the other layer or substrate, or intervening layer (s) may also be present therebetween. In addition, spatially relative terms, such as "above," "upper (portion)," "upper surface," and the like may be understood as meaning "below," "lower (portion)," "lower surface," and the like according to a reference orientation. In other words, the expressions of spatial orientations are to be construed as indicating relative orientations instead of absolute orientations. In addition, it will be understood that, although the terms "first", "second", etc. may be used herein to distinguish various elements, components, regions, layers and/or sections from one another, these elements, components, regions, layers and/or sections should not be limited by these terms.

Further, the widths, lengths, and thicknesses of certain elements, layers or features may be exaggerated for clarity, and like components will be denoted by like reference numerals throughout the specification.

FIGS. 1a to 1e are sectional views illustrating a method of manufacturing a light emitting diode according to one embodiment of the invention.

Referring to FIG. 1a, an assistant first conductive type clad layer 13a, an intrinsic clad layer 14, and a main first conductive type clad layer 13b are formed on a growth substrate 10. The assistant first conductive type clad layer 13a and the main first conductive type clad layer 13b constitute a first conductive type clad layer 13. Then, an active layer 15 and a second conductive type clad layer 17 are sequentially formed on the first conductive type clad layer 13. The first conductive type clad layer 13, the active layer 15, and the second conductive type clad layer 17 may constitute a light emitting structure (LS).

The growth substrate 10 may be a sapphire ($Al_2O_3$) substrate, a silicon carbide (SiC) substrate, a gallium nitride (GaN) substrate, an indium gallium nitride (InGaN) substrate, an aluminum gallium nitride (AlGaN) substrate, an aluminum nitride (AlN) substrate, a gallium oxide ($Ga_2O_3$) substrate, or a silicon substrate. Specifically, the growth substrate 10 may be a GaN substrate.

The main and assistant first conductive type clad layers 13a, 13b, that is, the first conductive type clad layer 13, are nitride semiconductor layers, which are doped with n-type dopants. In one example, the first conductive type clad layer 13 may be a Si-doped $In_xAl_yGa_{1-x-y}N$ layer ($0 \leq x \leq 1$, $0 \leq y \leq 1$, $x+y \leq 1$), in which Si impurities are doped as the n-type dopants. Specifically, the first conductive type clad layer 13 may be a Si-doped GaN layer. Alternatively, the first conductive type clad layer 13 may include a plurality of $In_xAl_yGa_{1-x-y}N$ layers ($0 \leq x \leq 1$, $0 \leq y \leq 1$, $x+y \leq 1$) having different compositions. When the growth substrate 10 is a GaN substrate and the first conductive type clad layer 13 is a GaN layer, the first conductive type clad layer 13 can be formed in higher quality with a significantly reduced amount of crystal defects than in the case where a different type of growth substrate 10 is used.

The intrinsic clad layer 14 is a dopant-free clad layer and may be a nitride semiconductor layer, specifically an $In_xAl_yGa_{1-x-y}N$ layer ($0 \leq x \leq 1$, $0 \leq y \leq 1$, $x+y \leq 1$), for example, a GaN layer. Specifically, the intrinsic clad layer 14 may have the same composition as that of the first conductive type clad layer 13 excluding the dopant. In some embodiments, the intrinsic clad layer 14 may be omitted.

The active layer 15 may be an $In_xAl_yGa_{1-x-y}N$ layer ($0 \leq x \leq 1$, $0 \leq y \leq 1$, $0 \leq x+y \leq 1$) and may have a single quantum well structure or a multi-quantum well (MQW) structure. In one example, the active layer 15 may have a single quantum well structure of an InGaN or AlGaN layer, or a multi-quantum well structure of InGaN/GaN, AlGaN/(In)GaN, or InAlGaN/(In)GaN.

The second conductive type clad layer 17 may also be a nitride semiconductor layer doped with p-type dopants. In one example, the second conductive type clad layer 17 may be an Mg or Zn-doped $In_xAl_yGa_{1-x-y}N$ layer ($0 \leq x \leq 1$, $0 \leq y \leq 1$, $0 \leq x+y \leq 1$), in which Mg or Zn impurities are doped as the p-type dopants. Specifically, the second conductive type clad layer 17 may be an Mg-doped GaN layer. Alternatively, the second conductive type clad layer 17 may include a plurality of $In_xAl_yGa_{1-x-y}N$ layers ($0 \leq x \leq 1$, $0 \leq y \leq 1$, $0 \leq x+y \leq 1$) having different compositions. The first conductive type clad layer 13, the intrinsic clad layer 14, the active layer 15, and the second conductive type clad layer 17 may be formed by MOCVD or MBE.

Before formation of the assistant first conductive type clad layer 13a, a buffer layer (not show) may be formed on the growth substrate 10. The buffer layer may be a ZnO layer, an $Al_xGa_{1-x}N$ layer ($0 \leq x \leq 1$), or a CrN layer. When the growth substrate 10 is a GaN substrate and the first conductive type clad layer 13 is a GaN layer, the buffer layer may be omitted.

An ohmic contact layer 19 is formed on the second conductive type clad layer 17 to form ohmic contact with the second conductive type clad layer 17. To this end, an electrically conductive layer is formed on the second conductive type clad layer 17, followed by heat treatment. The ohmic contact layer 19 may be a Pt layer, a Pt-alloy layer, a Ni layer, a Ni-alloy layer, or multiple layers thereof.

A support substrate 20 may be bonded to the ohmic contact layer 19. Before bonding the support substrate 20 thereto, a bonding layer such as a thermo-compressive bonding layer or a eutectic bonding layer may be formed between the ohmic contact layer 19 and the support substrate 20. The support substrate 20 may be a semiconductor substrate such as a Si, GaAs, GaP or InP substrate, or a metal substrate such as a Cu or W substrate. Alternatively, the support substrate 20 may be a plated substrate, which is formed on the ohmic contact layer 19 by electroplating.

Figure 1B:
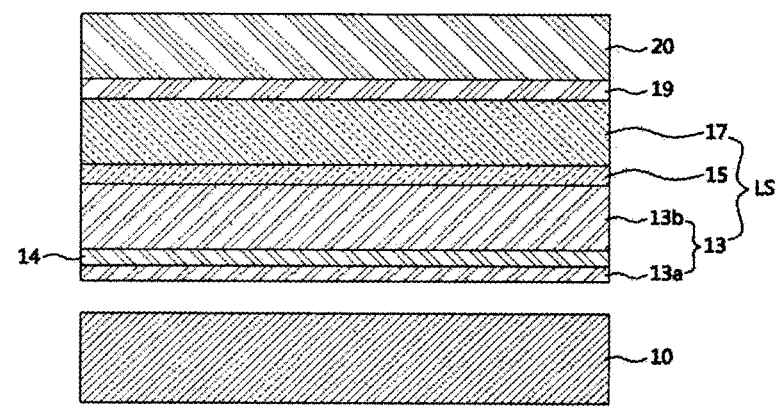

Referring to FIG. 1b, the growth substrate 10 is removed to expose a surface of the first conductive type clad layer 13. In one example, when the growth substrate 10 is a sapphire substrate, the growth substrate 10 may be removed by LLO (laser lift-off). In another example, when the growth substrate 10 is a GaN substrate, the GaN substrate may be removed by grinding.

Figure 1C:
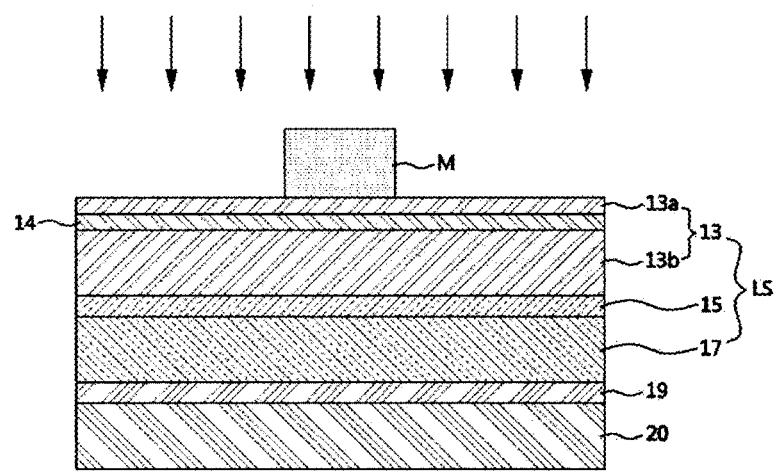

Referring to FIG. 1c, a mask layer M may be formed on the surface of the first conductive type clad layer 13 exposed by removing the growth substrate 10. The mask layer M may be an insulation layer, such as a silicon oxide layer or a silicon nitride layer, or a photoresist layer.

Impurities may be implanted into the surface of the first conductive type clad layer 13 using the mask layer M as a mask. To this end, the mask layer M has a high thickness capable of preventing penetration of impurities therethrough. As a result, defects can be generated within the surface of the first conductive type clad layer 13. However, it is possible to form defects within the surface of the first conductive type clad layer 13 by other methods than impurity implantation. The defects may be generated within the assistant first conductive type clad layer 13a.

As for the impurities, any dopant may be used so long as the dopant can form defects within the surface of the first conductive type clad layer 13. In one example, the impurities may be a first conductive type dopant and may be the same as the first conductive type dopant doped into the first conductive type clad layer 13. In one example, the first conductive type dopant may be Si (silicon) or H (hydrogen).

Figure 1D:
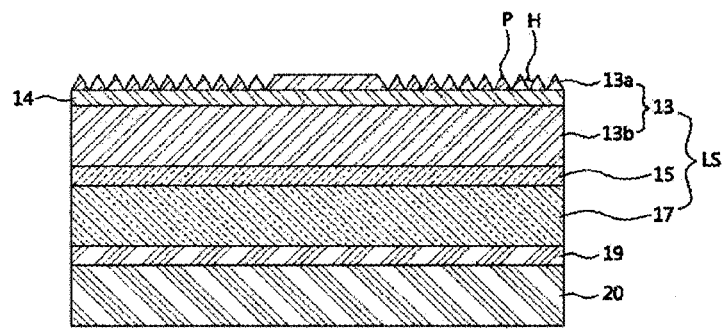

Referring to FIG. 1d, the mask layer M is removed. Then, a plurality of grooves H is formed within the first conductive type clad layer 13 by etching the defects. Lattice defects such as dislocations are thermodynamically unstable and can be preferentially etched during the etching process. Since defects are not generated within a portion of the first conductive type clad layer 13 covered by the mask layer M, very few grooves H are formed therein. In the light emitting diode, grooves and protrusions P defined by the grooves, that is, roughness, provide a high possibility of allowing photons to escape from the active layer 15. As a result, the light emitting diode has improved light extraction efficiency.

The grooves H may be formed by wet etching. At this time, an etching solution infiltrates the first conductive type dopant along the defects and preferentially etches the defects. In one example, wet etching may be photo-enhanced chemical (PEC) etching. Specifically, etching may be carried out by placing the resultant in an electrolyte, with the mask layer M removed from the resultant, followed by photo-irradiation.

When the growth substrate 10 (see FIG. 1a) is a GaN substrate and the first conductive type clad layer 13 is a GaN layer, very few defects are formed within the first conductive type clad layer 13. Accordingly, it is advantageous to form additional defects in order to form the grooves within the surface of the first conductive type clad layer by etching the defects.

Etching may be stopped at the intrinsic clad layer 14. That is, since the intrinsic clad layer 14 does not include impurities and is thus substantially free from defects, etching carried out along the defects can be stopped at the intrinsic clad layer 14. At this time, at least some bottoms of the grooves H may adjoin the intrinsic clad layer 14. In this case, it is possible to prevent the grooves H from reaching the light emitting layer 15 due to unexpected excessive etching, thereby preventing deterioration in device efficiency.

Further, when the grooves H are formed by implanting the impurities into the surface of the first conductive type clad layer 13, specifically, into the assistant first conductive type clad layer 13a, the impurity concentration of the protrusions P defined by the grooves H may be higher than that of an inside portion of the first conductive type clad layer 13, specifically, the impurity concentration of the main first conductive type clad layer 13b.

Figure 1E:
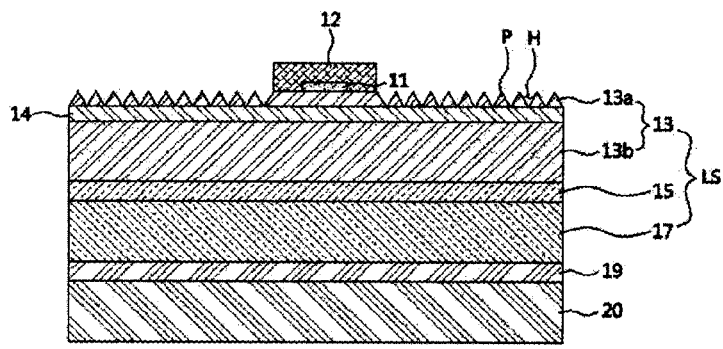

Referring to FIG. 1e, a first electrode 12 may be formed on the first conductive type clad layer 13 having the grooves H formed therein. Specifically, the first electrode 12 may be formed on a region of the first conductive type clad layer 13, which is covered by the mask M such that the grooves H are not formed therein. The first electrode 12 may be an Al layer, a Pt layer, a Ni layer, or an Au layer. Further, a second electrode (not shown) may be formed under the support substrate 20. However, even in the case where the second electrode is not formed, the support substrate 20 can act as the second electrode.

Before forming the first electrode 12, an insulation pattern 11 may be formed on the first conductive type clad layer 13, specifically, on the portion of the first conductive type clad layer 13 covered by the mask M and not having the grooves H therein. The insulation pattern 11 may have the same or smaller width than the first electrode 12. In this case, since current is blocked in a vertically lower direction of the insulation pattern 11 upon application of voltage to the first electrode 12, the light emitting diode can relieve current crowding while improving current spreading. The insulation pattern 11 may be a distributed Bragg reflector (DBR) in which pairs of insulation layers having different indices of refraction are repeatedly stacked one above another. In this case, the light emitting diode has a high possibility of allowing light generated from the active layer 15 to be emitted towards a region in which the first electrode 12 is not formed, thereby further improving light extraction efficiency.

Figure 2A:
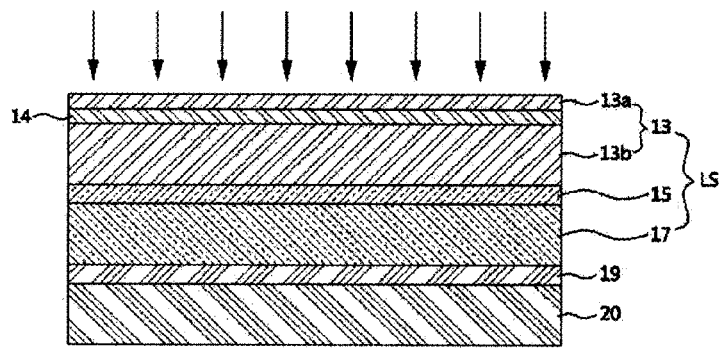
FIGS. 2a, 2b, and 2c are sectional views illustrating a method of manufacturing a light emitting diode according to another embodiment of the present invention.
Figure 2B:
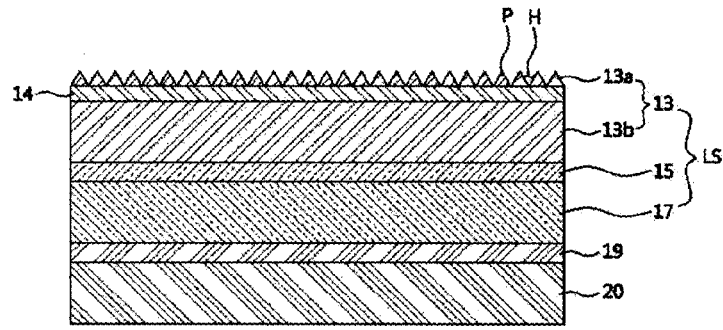
Figure 2C:
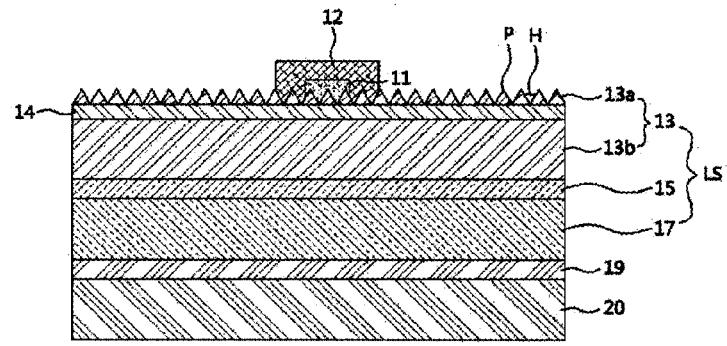

FIG. 2a to FIG. 2c are sectional views illustrating a method of manufacturing a light emitting diode according to another embodiment of the present invention. The method of manufacturing a light emitting diode according to this embodiment is similar to the method described with reference to FIG. 1a to FIG. 1e.

Referring to FIG. 2a, impurities may be implanted into an overall surface of the first conductive type clad layer 13 exposed by removing the growth substrate 10 (see FIG. 1b). As a result, defects can be generated within the overall surface of the first conductive type clad layer 13. However, it is possible to form defects within the surface of the first conductive type clad layer 13 by other methods than impurity implantation. The defects may be generated within the assistant first conductive type clad layer 13a.

Referring to FIG. 2b, a plurality of grooves H is formed within the surface of the first conductive type clad layer 13 by etching the defects. The grooves H may be formed by wet etching. In one example, wet etching may be photo-enhanced chemical (PEC) etching. Etching may be stopped at the intrinsic clad layer 14, which contains substantially no impurities and thus is substantially free from defects. Thus, at least some bottoms of the grooves H may adjoin the intrinsic clad layer 14.

Referring to FIG. 2c, a first electrode 12 may be formed on the first conductive type clad layer 13 having the grooves H formed therein. Before the first electrode 12 is formed, an insulation pattern 11 may be formed on the first conductive type clad layer 13. The width of the insulation pattern 11 may be the same or less than that of the first electrode 12.

When the insulation pattern 11 is not formed, or the width of the insulation pattern 11 is smaller than that of the first electrode 12, the first electrode 12 may adjoin protrusions P defined by the grooves H. On the other hand, when the grooves H are formed by implanting a first conductive type dopant into the surface of the first conductive type clad layer 13, the concentration of the first conductive type dopant may increase in the protrusions P remaining after etching for formation of the grooves H. In this case, improved ohmic contact can be formed between the first electrode 12 and the protrusions P.

Figure 3A:
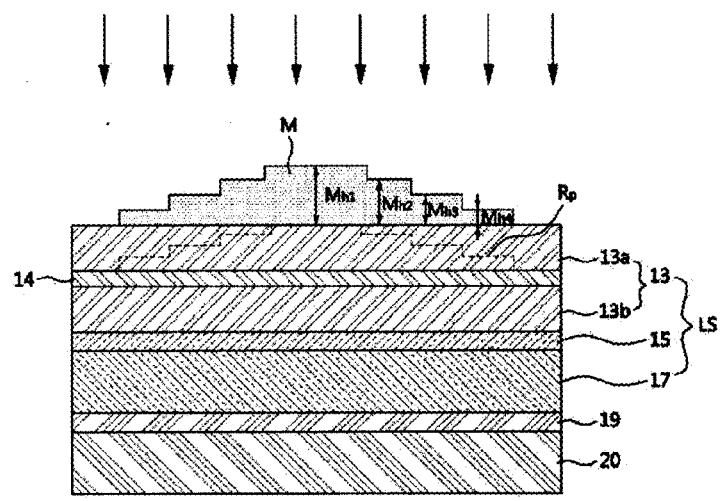
FIGS. 3a, 3b, and 3c are sectional views illustrating a method of manufacturing a light emitting diode according to a further embodiment of the present invention.
Figure 3B:
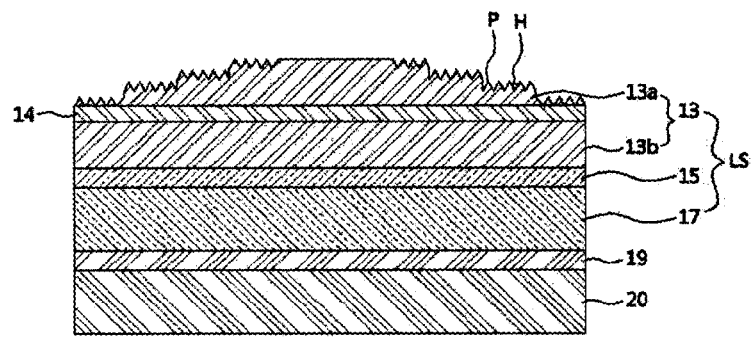
Figure 3C:
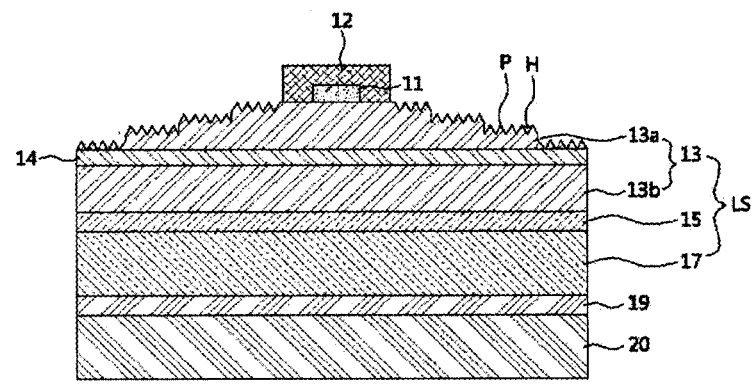

FIG. 3a to FIG. 3c are sectional views illustrating a method of manufacturing a light emitting diode according to a further embodiment of the present invention. Except for some features described below, the method of manufacturing a light emitting diode according to this embodiment is similar to the method described with reference to FIG. 1a to FIG. 1e.

Referring to FIG. 3a, a mask layer M may be formed on the surface of the first conductive type clad layer 13. The mask layer M may be an insulation layer such as a silicon oxide layer or a silicon nitride layer, or a photoresist layer. Impurities may be implanted into the surface of the first conductive type clad layer using the mask layer M as a mask.

The impurities may be implanted into the surface of the first conductive type clad layer 13 through the mask layer M. Here, a portion of the mask layer M corresponding to a region in which an electrode described below will be formed may have a thickness Mh1 capable of preventing the impurities from penetrating the portion of the mask layer M. Although the mask layer M is shown as having the highest thickness at a central portion thereof, the present invention is not limited thereto. Alternatively, the mask layer M may have the highest thickness in the region in which the electrode described below will be formed. Excluding the region in which the electrode described below will be formed, the mask layer M may have a gradually decreasing thickness (Mh2, Mh3, Mh4) from the central portion of the surface of the first conductive type clad layer 13 towards an outer periphery thereof. In this case, Rp (Projected Range) of the implanted impurities may be deepened from the central portion of the surface of the first conductive type clad layer 13 towards the outer periphery thereof. To this end, a detailed thickness of the mask layer M and energy for impurity implantation can be adjusted.

The impurities implanted into the surface of the first conductive type clad layer 13 can form defects therein. Since Rp of the implanted impurities is deepened from the central portion of the surface of the first conductive type clad layer 13 towards the outer periphery thereof, the defects may also have a gradually increasing depth from the central portion of the surface of the first conductive type clad layer 13 towards the outer periphery thereof. The defects may be formed within the assistant first conductive type clad layer 13a.

Referring to FIG. 3b, the mask layer M is removed. Then, a plurality of grooves H is formed within the surface of the first conductive type clad layer 13 by etching the defects. Since the defects are formed to have a gradually increasing depth from the central portion of the surface of the first conductive type clad layer 13 towards the outer periphery thereof, bottom levels of the grooves may be gradually lowered from the central portion of the surface of the first conductive type clad layer 13 towards the outer periphery thereof. In this case, an upper surface of the light emitting diode may have an inclination from the central portion thereof towards the outer periphery thereof. With this structure, the light emitting diode has improved light spreading and is suitable for lighting.

Since the defects are not formed in the portion of the first conductive type clad layer 13 covered by the thickest portion of the mask layer M, very few grooves H can be formed therein. The grooves H may be formed by wet etching. In one example, wet etching may be photo-enhanced chemical (PEC) etching. Etching may be stopped at the intrinsic clad layer 14, which does not contain the impurities and thus is substantially free from defects. Thus, at least some bottoms of the grooves H, specifically, the bottoms of the grooves H formed in the deepest region of the first conductive type clad layer 13, may adjoin the intrinsic clad layer 14.

Referring to FIG. 3c, a first electrode 12 may be formed on the portion of the first conductive type clad layer 13, which is covered by the thickest portion of the mask layer M so that the grooves H are not formed therein. Before the first electrode 12 is formed, an insulation pattern 11 may be formed on the first conductive type clad layer 13, specifically, on the portion of the first conductive type clad layer 13, which is covered by the mask layer M so that the grooves H are not formed therein. The width of the insulation pattern 11 may be the same or less than that of the first electrode 12.

Figure 4A:
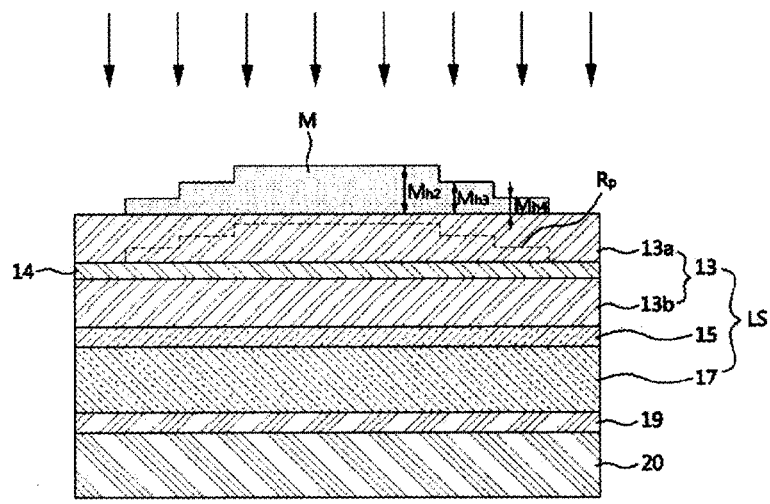
FIGS. 4a, 4b, and 4c are sectional views illustrating a method of manufacturing a light emitting diode according to yet another embodiment of the present invention.
Figure 4B:
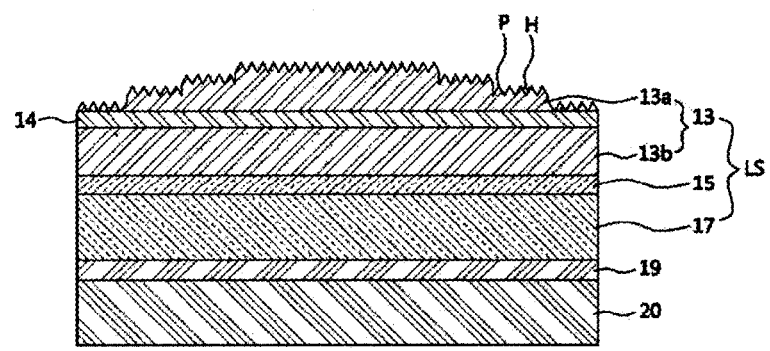
Figure 4C:
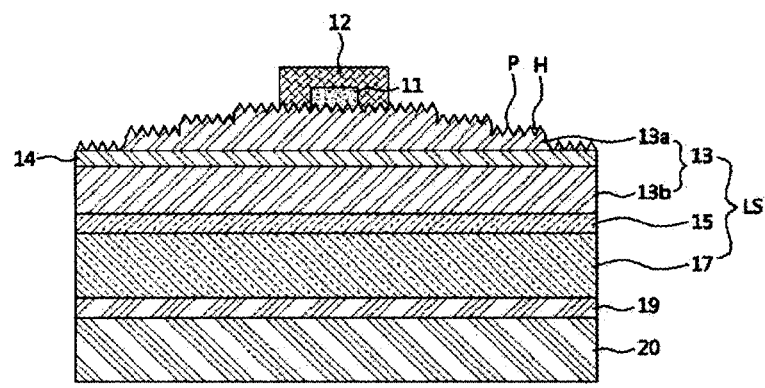

FIG. 4a to FIG. 4c are sectional views illustrating a method of manufacturing a light emitting diode according to yet another embodiment of the present invention. Except for some features described below, the method of manufacturing a light emitting diode according to this embodiment is similar to the method described with reference to FIG. 1a to FIG. 1e.

Referring to FIG. 4a, a mask layer M may be formed on the surface of the first conductive type clad layer 13. The mask layer M may be an insulation layer, such as a silicon oxide layer or a silicon nitride layer, or a photoresist layer. Impurities may be implanted into the surface of the first conductive type clad layer using the mask layer M as a mask. Although the mask layer M may have a gradually decreasing thickness (Mh2, Mh3, Mh4) from the central portion of the surface of the first conductive type clad layer 13 towards the outer periphery thereof, the impurities may be implanted into the surface of the first conductive type clad layer 13 through the thickest portion (Mh2) of the mask layer M. In this case, Rp (Projected Range) of the implanted impurities may be deepened from the central portion of the surface of the first conductive type clad layer 13 towards the outer periphery thereof. To this end, a detailed thickness of the mask layer M and energy for impurity implantation can be adjusted.

The impurities implanted into the surface of the first conductive type clad layer 13 can form defects therein. Since Rp of the implanted impurities is deepened from the central portion of the surface of the first conductive type clad layer 13 towards the outer periphery thereof, the defects may also have a gradually increasing depth from the central portion of the surface of the first conductive type clad layer 13 towards the outer periphery thereof. The defects may be formed within the assistant first conductive type clad layer 13a.

Referring to FIG. 4b, the mask layer M is removed. Then, a plurality of grooves H is formed within the surface of the first conductive type clad layer 13 by etching the defects. Since the defects are formed to have a gradually increasing depth from the central portion of the surface of the first conductive type clad layer 13 towards the outer periphery thereof, bottom levels of the grooves may be gradually lowered from the central portion of the surface of the first conductive type clad layer 13 towards the outer periphery thereof. In this case, an upper surface of the light emitting diode may have an inclination from the central portion thereof towards the outer periphery thereof. With this structure, the light emitting diode has improved light spreading and is suited to lighting.

The grooves H may be formed by wet etching. In one example, wet etching may be photo-enhanced chemical etching. Etching may be stopped at the intrinsic clad layer 14, which does not contain the impurities and thus is substantially free from defects. Thus, at least some bottoms of the grooves H, specifically, the bottoms of the grooves H formed in the deepest region of the first conductive type clad layer 13, may adjoin the intrinsic clad layer 14.

Referring to FIG. 4c, a first electrode 12 may be formed on the first conductive type clad layer 13 having the grooves H formed therein. Before the first electrode 12 is formed, an insulation pattern 11 may be formed on the first conductive type clad layer 13. The width of the insulation pattern 11 may be the same or less than that of the first electrode 12.

When the insulation pattern 11 is not formed, or the width of the insulation pattern 11 is smaller than that of the first electrode 12, the first electrode 12 may adjoin protrusions P defined by the grooves H. On the other hand, when the grooves H are formed by implanting a first conductive type dopant into the surface of the first conductive type clad layer 13, the concentration of the first conductive type dopant may increase in the protrusions P remaining after etching for formation of the grooves H. In this case, improved ohmic contact can be formed between the first electrode 12 and the protrusions P.

Figure 5A:
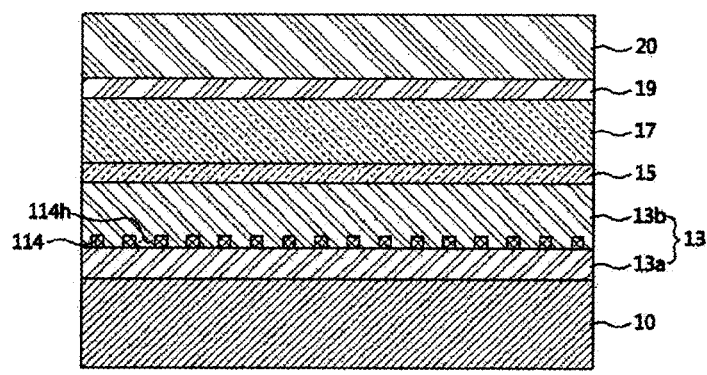
FIGS. 5a, 5b, and 5c are sectional views illustrating a method of manufacturing a light emitting diode according to yet another embodiment of the present invention.
Figure 5B:
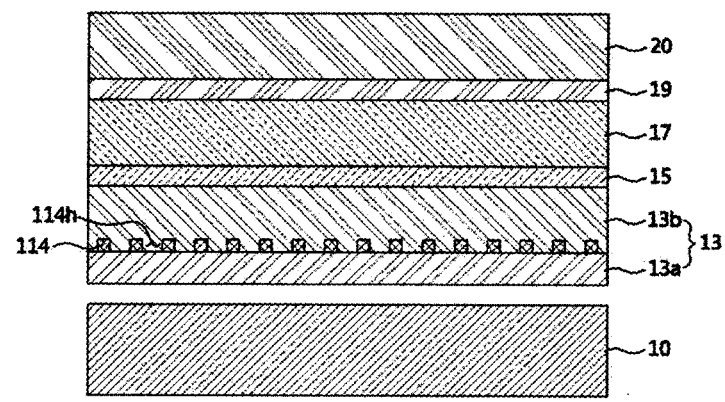
Figure 5C:
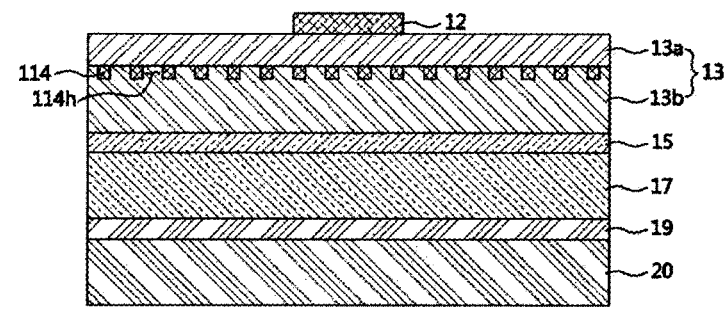

FIG. 5a to FIG. 5c are sectional views illustrating a method of manufacturing a light emitting diode according to yet another embodiment of the present invention.

Referring to FIG. 5a, a lower first conductive type clad layer 13a, a light scattering pattern 114, and an upper first conductive type clad layer 13b are formed on a growth substrate 10. The lower first conductive type clad layer 13a and the upper first conductive type clad layer 13b constitute a first conductive type clad layer 13. Then, an active layer 15 and a second conductive type clad layer 17 are sequentially formed on the first conductive type clad layer 13. The first conductive type clad layer 13, the active layer 15, and the second conductive type clad layer 17 may constitute a light emitting structure.

The growth substrate 10 is the same as that of the embodiment shown in FIG. 1a and a detailed description thereof will be omitted. In addition, the upper and lower first conductive type clad layers 13a, 13b, that is, the first conductive type clad layer 13, are also the same as those of the embodiment shown in FIG. 1a and detailed descriptions thereof will be omitted.

The light scattering pattern 114 may be a pattern of a material having a different index of refraction than the first conductive type clad layer 13, for example, a pattern of a material having a lower index of refraction than the first conductive type clad layer 13. The light scattering pattern 114 may be formed by deposition and photolithography. The light scattering pattern 114 may be a dielectric layer, for example, a single layer of $SiO_2$ (n=1.4), $Al_2O_3$ (n=1.6), $SiN_x$ (0.5<x<1.8, n=2.05~2.25) and $TiO_2$ (n=2.1), or may be a distributed Bragg reflector (DBR), in which pairs of material layers selected from these materials are repeatedly stacked one above another. The materials and thickness of the light scattering pattern 114 may be suitably selected according to wavelengths of light emitted from the active layer 15. Although the light scattering pattern 114 has a rectangular cross-section in this embodiment, it should be understood that the present invention is not limited thereto and the light scattering pattern 114 may have a circular cross-section or a polygonal cross-section, such as a triangular cross-section and the like.

The light scattering pattern 114 defines non-patterned areas therein, that is, a plurality of openings 114h. The upper first conductive type clad layer 13b can be grown from the lower first conductive type clad layer 13a by epitaxial lateral overgrowth through the openings 114h of the light scattering pattern 114. As a result, lattice mismatch can be relieved in the upper first conductive type clad layer 13b.

The active layer 15 and the second conductive type clad layer 17 are the same as those described with reference to FIG. 1a and detailed descriptions thereof will be omitted. Further, before the lower first conductive type clad layer 13a is formed, a buffer layer (not shown) may be formed on the growth substrate 10, as described with reference to FIG. 1a.

As described with reference to FIG. 1a, an ohmic contact layer 19 is formed on the second conductive type clad layer 17 to form ohmic contact with the second conductive type clad layer 17, and a support substrate 20 may be bonded to the ohmic contact layer 19. Detailed descriptions thereof will be omitted to avoid repetition.

Referring to FIG. 5b, as described with reference to FIG. 1b, the first conductive type clad layer 13 may be exposed by removing the growth substrate 10, and a detailed description thereof will be omitted to avoid repetition.

Referring to FIG. 5c, a first electrode 12 may be formed on the first conductive type clad layer 13 exposed by removing the growth substrate 10. The first electrode 12 may be an Al layer, a Pt layer, a Ni layer, or an Au layer. Furthermore, a second electrode (not shown) may be formed under the support substrate 20. However, even in the case where the second electrode is not formed, the support substrate 20 can act as the second electrode.

Figure 6:
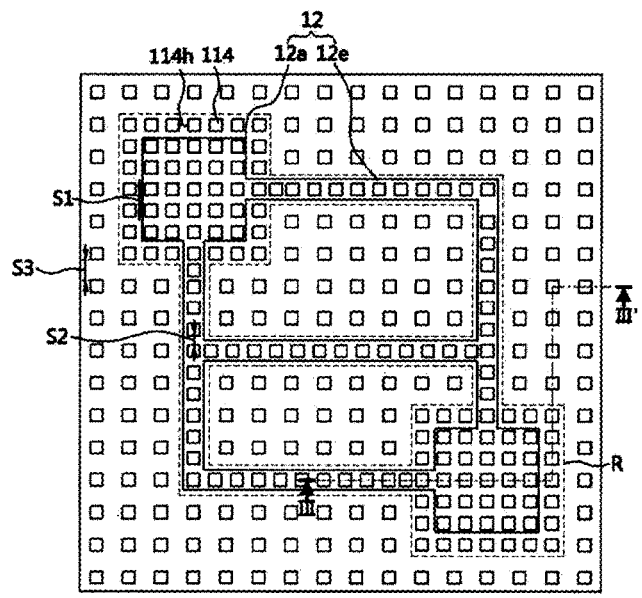
FIG. 6 is a layout view of a light emitting diode according to yet another embodiment of the present invention.
Figure 7:
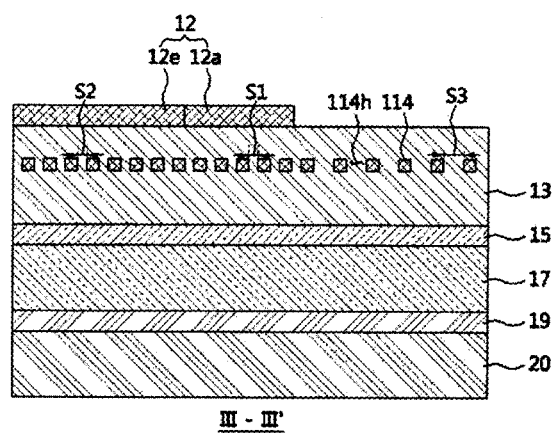
FIG. 7 is a sectional view of the light emitting diode taken along line III-III' of FIG. 6.

FIG. 6 is a sectional view of a super-lattice layer according to yet another embodiment of the present invention. FIG. 7 is a sectional view of the light emitting diode taken along line III-III of FIG. 6. Except for some features described below, the light emitting diode according to this embodiment is similar to the light emitting diode described with reference to FIG. 5a to FIG. 5c.

Referring to FIGS. 6 and 7, a light emitting structure including a first conductive type clad layer 13, a second conductive type clad layer 17 disposed below the first conductive type clad layer 13, and an active layer 15 formed between the clad layers 13, 17 is provided. A first electrode 12 is disposed on the first conductive type clad layer 13 to be electrically connected to the first conductive type clad layer 13. The first electrode 12 includes bonding pads 12a and an extension 12e extending from the bonding pads 12a. In addition, a support substrate 20 may be disposed under the second conductive type clad layer 17 and an ohmic contact layer 19 may be disposed between the second conductive type clad layer 17 and the support substrate 20 to form ohmic contact with the second conductive type clad layer 17. Further, a second electrode (not shown) may be disposed under the support substrate 20. However, when the second electrode is not formed, the support substrate 20 can act as the second electrode.

The first conductive type clad layer 13 includes a light scattering pattern 114 therein. The light scattering pattern 114 may improve light extraction efficiency by scattering light generated from the active layer 15. The light scattering pattern 114 may be formed of a material having a different index of refraction than the first conductive type clad layer 13. That is, the light scattering pattern 114 may be a dielectric layer. Further, the light scattering pattern 114 defines a plurality of openings 114h therein. When bias is applied between the first electrode 12 and the second electrode, the light scattering pattern 114 can block current flow. In other words, the current flow can be restricted to the openings 114h defined by the light scattering pattern 114.

The openings 114h may have a smaller width or area in a region R overlapping the first electrode 12 than in a region not overlapping the first electrode 12. At this time, current flow in the light emitting structure can be greater in the region not overlapping the first electrode 12 than in the region R overlapping the first electrode 12. As a result, the light emitting diode can relieve current crowding in the region R overlapping the first electrode 12, thereby improving lateral current spreading in the light emitting structure. Further, photo-generation efficiency within the active layer 15, that is, internal quantum efficiency, can be improved together with reliability.

Furthermore, although the region R in which the openings 114h have a small width or area can coincide with a region overlapping the first electrode 12, that is, a region disposed perpendicularly below the first electrode 12, the region R in which the openings 114h have a small width or area may have a greater area than the region disposed perpendicularly below the first electrode 12, when considering misalignment. In other words, the region R in which the openings 114h have a small width or area may be defined in the region overlapping the first electrode 12 and a region adjacent thereto. Alternatively, the region R in which the openings 114h have a small width or area may overlap only the bonding pad 12a excluding the extension 12e.

Specifically, the light scattering pattern 114 may be composed of a plurality of dots, as shown in the drawings. The dots may have a diameter of 0.5 µm or more and a height of 0.1 µm or more. Regions between the dots correspond to the openings 114h defined by the light scattering pattern 114. A width S1 or S2 of a distance between the dots disposed in the region R overlapping the first electrode 12 may be smaller than a width S3 of a distance between the dots disposed in the region not overlapping the first electrode 12.

Figure 8:
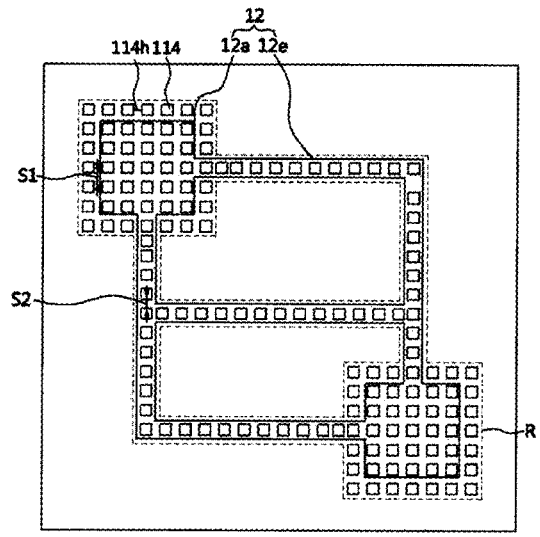
FIG. 8 is a partial layout view of a light emitting diode according to yet another embodiment of the present invention.

FIG. 8 is a partial layout view of a light emitting diode according to another embodiment of the present invention. Except for some features described below, the light emitting diode according to this embodiment may be similar to the light emitting diode described with reference to FIGS. 6 and 7.

Referring to FIG. 8, the light scattering pattern 114 may be disposed in a region R overlapping the first electrode 12. When the light scattering pattern 114 is not formed, light emitted from a region disposed perpendicularly below the first electrode 12 of the active layer 15 (see FIG. 5c or FIG. 7) is blocked by the first electrode 12. On the contrary, as the light scattering pattern 114 is formed, the light emitted from the region disposed perpendicularly below the first electrode 12 of the active layer 15 (see FIG. 5c or FIG. 7) can be scattered by the light scattering pattern 114 to be emitted to a region in which the first electrode 12 is not formed. As a result, the light emitting diode can have improved light extraction efficiency.

Furthermore, current flow can be restricted to the openings 114h corresponding to regions in which the light scattering pattern 114 is not formed. At this time, as the light scattering pattern 114 is disposed only in the region R overlapping the first electrode 12, current flow may be greater in the region not overlapping the first electrode 12 than in the region R overlapping the first electrode 12. As a result, the light emitting diode can have improved lateral current spreading. Further, although the region R having the light scattering pattern 114 formed therein can coincide with the region disposed perpendicularly below the first electrode 12, the region R having the light scattering pattern 114 formed therein may have a greater area than the region disposed perpendicularly below the first electrode 12, when considering misalignment. In other words, the region R having the light scattering pattern 114 formed therein may be defined in the region overlapping the first electrode 12 and a region adjacent thereto.

Although the light scattering pattern 114 is illustrated as overlapping the bonding pads 12a and the extension 12e, it should be understood that the present invention is not limited thereto. In other embodiments, the light scattering pattern 114 may be disposed only under the bonding pads 12a without being formed under the extension 12e.

Figure 9:
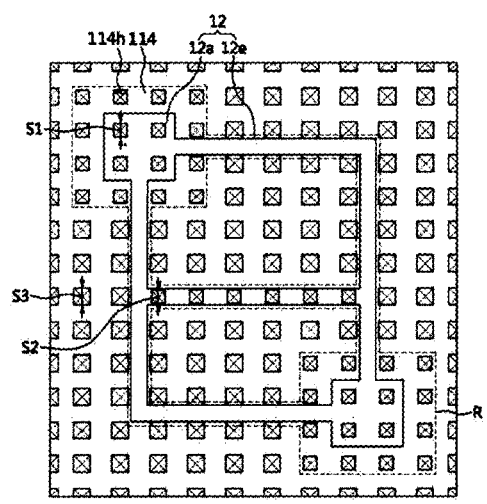
FIG. 9 is a layout view of a light emitting diode according to yet another embodiment of the present invention.

FIG. 9 is a partial layout view of a light emitting diode according to another embodiment of the present invention. Except for some features described below, the light emitting diode according to this embodiment may be similar to the light emitting diode described with reference to FIGS. 5a to 5c, 6, and 7.

Referring to FIG. 9, the light scattering pattern 114 may be a layer having a plurality of through-holes 114h. The through-holes 114h are openings defined by the light scattering pattern 114.

The openings 114h may have a smaller width or area in a region R overlapping the first electrode 12 than in a region not overlapping the first electrode 12. At this time, since current flow in the light emitting structure can be restricted to the through-holes 114h, the current flow may be greater in the region not overlapping the first electrode 12 than in the region R overlapping the first electrode 12. As a result, the light emitting diode can improve lateral current spreading in the light emitting structure. Widths S1, S2 of through-holes disposed in the region R overlapping the first electrode 12 may be smaller than a width S3 of the through-holes disposed in the region not overlapping the first electrode 12.

Further, although the region R in which the through-holes 114h have a small width or area can coincide with a region disposed perpendicularly below the first electrode 12, the region R in which the through-holes 114h have a small width or area may have a greater area than the region disposed perpendicularly below the first electrode 12, when considering misalignment. In other words, the region R in which the through-holes 114h have a small width or area may be defined in the region overlapping the first electrode 12 and a region adjacent thereto. Alternatively, the region R in which the through-holes 114h have a small width or area may overlap only the bonding pad 12a excluding the extension 12e.

Figure 10:
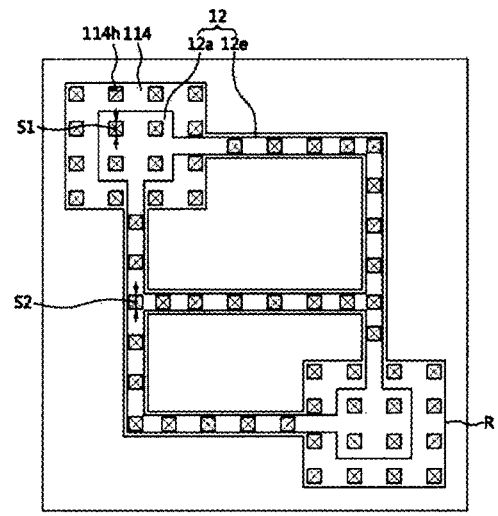
FIG. 10 is a partial layout view of a light emitting diode according to yet another embodiment of the present invention.

FIG. 10 is a partial layout view of a light emitting diode according to yet another embodiment of the present invention. Except for some features described below, the light emitting diode according to this embodiment may be similar to the light emitting diode described with reference to FIG. 9.

Referring to FIG. 10, the light scattering pattern 114 having the through-holes 114h may be disposed only in the region R overlapping the first electrode 12. The region not overlapping the first electrode 12 may be open without the light scattering pattern 114 formed therein. At this time, light emitted from the region disposed perpendicularly below the first electrode 12 of the active layer 15 (see FIG. 5c or FIG. 7) can be scattered by the light scattering pattern 114 to be emitted to a region in which the first electrode 12 is not formed. As a result, the light emitting diode can have improved light extraction efficiency.

Furthermore, as the light scattering pattern 114 is disposed only in the region R overlapping the first electrode 12, current flow may be greater in the region not overlapping the first electrode 12 than in the region R overlapping the first electrode 12. As a result, the light emitting diode can have improved lateral current spreading. Further, although the region R having the light scattering pattern 114 formed therein can coincide with the region disposed perpendicularly below the first electrode 12, the region R having the light scattering pattern 114 formed therein may have a greater area than the region disposed perpendicularly below the first electrode 12, when considering misalignment. In other words, the region R having the light scattering pattern 114 formed therein may be defined in the region overlapping the first electrode 12 and a region adjacent thereto.

Although the light scattering pattern 114 is illustrated as overlapping a bonding pad 12a and an extension 12e, it should be understood that the present invention is not limited thereto. In other embodiments, the light scattering pattern 114 may be disposed only under the bonding pad 12a without being formed under the extension 12e.

Figure 11:
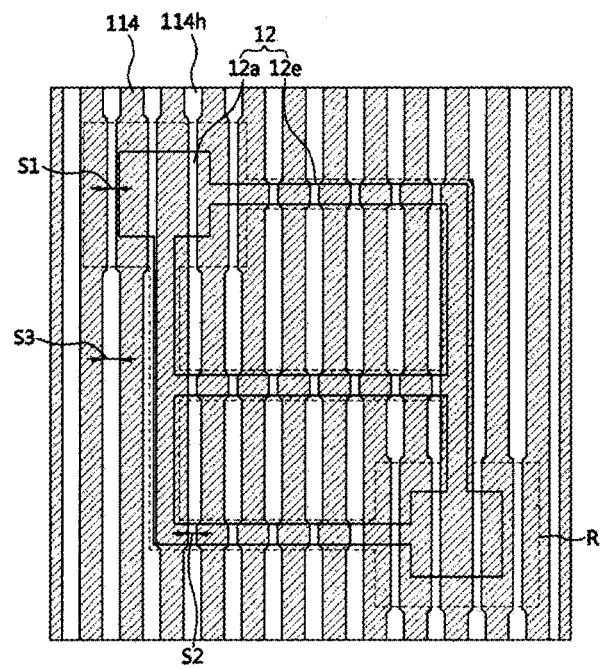
FIG. 11 is a layout view of a light emitting diode according to yet another embodiment of the present invention.

FIG. 11 is a partial layout view of a light emitting diode according to another embodiment of the present invention. Except for some features described below, the light emitting diode according to this embodiment may be similar to the light emitting diode described with reference to FIG. 5a to FIG. 5c, FIG. 6, and FIG. 7.

Referring to FIG. 11, the light scattering pattern 114 may be a line pattern. Here, regions 114h between lines of the line pattern are openings defined by the light scattering pattern 114.

The openings, that is, the regions 114h between the lines of the line pattern 114h, may have a smaller width or area in a region R overlapping the first electrode 12 than in a region not overlapping the first electrode 12. At this time, current flow in the light emitting structure can be greater in the region not overlapping the first electrode 12 than in the region R overlapping the first electrode 12. As a result, the light emitting diode can have improved lateral current spreading in the light emitting structure. Further, although the region R in which the regions 114h between the lines of the line pattern have a small width or area can coincide with the region disposed perpendicularly below the first electrode 12, the region R in which the regions 114h between the lines of the line pattern have a small width or area may have a greater area than the region disposed perpendicularly below the first electrode 12, when considering misalignment. In other words, the region R in which the regions 114h between the lines of the line pattern have a small width or area may be defined in the region overlapping the first electrode 12 and a region adjacent thereto. Further, unlike the structure shown in the figure, the region R in which the through-holes 114h have a small width or area may overlap only the bonding pads 12a excluding the extension 12e.

Figure 12:
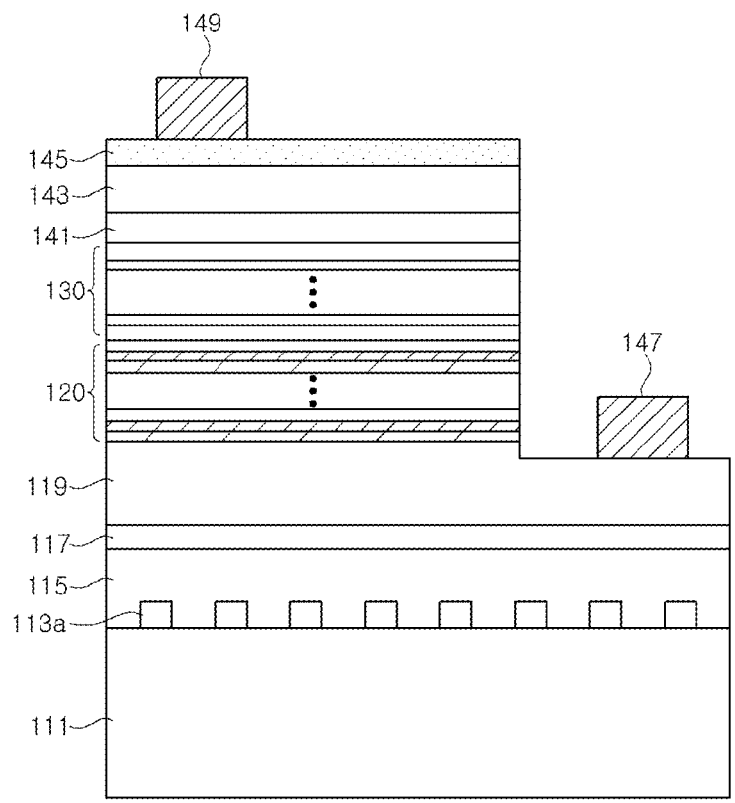
FIG. 12 is a sectional view of a light emitting diode according to yet another embodiment of the present invention.

FIG. 12 is a sectional view of a light emitting diode according to yet another embodiment of the present invention.

Referring to FIG. 12, the light emitting diode includes a gallium nitride substrate 111, a pattern 113a of a dielectric material, an n-type contact layer 119, an active layer 130, and a p-type contact layer 143. In addition, the light emitting diode may include a lower GaN layer 115, an intermediate layer 117, a super-lattice layer 120, a p-type clad layer 141, a transparent electrode layer 145, a first electrode 147 and a second electrode 149.

The gallium nitride substrate 111 may have a growth plane of c-plane, m-plane or a-plane. In addition, the growth plane of the gallium nitride substrate 111 may have an inclination for assisting growth of epitaxial layers. Such a gallium nitride substrate 111 may be fabricated by, for example, HYPE.

The pattern 113a of the dielectric material is formed on the gallium nitride substrate 111. The dielectric material may have a lower index of refraction than the gallium nitride substrate 111, and may be formed of, for example, $SiO_2$ or $Si_3N_4$. The pattern 113a of the dielectric material may be formed by forming a dielectric layer of $SiO_2$ or $Si_3N_4$ through chemical vapor deposition, followed by patterning through photolithography and etching. The pattern 113a of the dielectric material may be formed in a stripe shape, an island shape, or a mesh shape.

Figure 13:
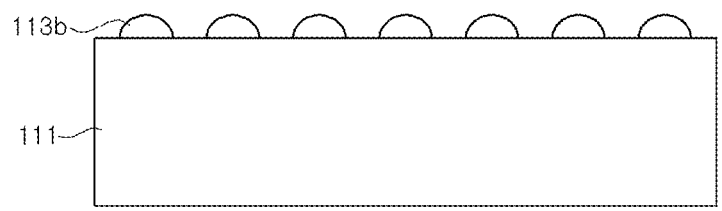
FIGS. 13 and 14 are schematic sectional views illustrating various patterns of a dielectric material.
Figure 14:
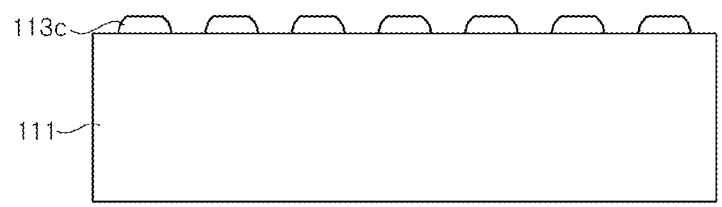

Although the pattern 113a of the dielectric material has a rectangular cross-section as shown in FIG. 12, it should be understood that the present invention is not limited thereto. For example, as shown in FIG. 13, a pattern 13b of a dielectric material may have a hemispherical shape with a convex upper surface. Alternatively, the pattern of the dielectric material may have a frusto-hemispherical shape with a flat upper surface, as shown in FIG. 14.

The lower GaN layer 115 may be formed of undoped GaN or Si-doped GaN. The lower GaN layer 115 is formed to cover the pattern 113a of the dielectric material by epitaxial lateral overgrowth. As a result, the pattern 113a of the dielectric material is disposed at an interface between the gallium nitride substrate 111 and the lower GaN layer 115. However, the present invention is not limited thereto. Alternatively, the lower GaN layer 115 may be formed by growing the lower GaN layer 115 or part thereof on the gallium nitride substrate 111, forming the pattern 113a of the dielectric material, and growing the lower GaN layer 115 again. In this case, the pattern 113a of the dielectric material is separated from the gallium nitride substrate 111.

The intermediate layer 117 may be disposed on the lower GaN layer 115. The intermediate layer 117 is formed of a gallium nitride-based epitaxial layer having a different composition from that of the gallium nitride substrate 111 and a wider band gap than the well layer of the multi-quantum well structure. For example, the intermediate layer 117 may be formed of AlInN, AlGaN, or AlInGaN. The n-type contact layer 119 and the lower GaN layer 115 are grown at a high temperature of about 1000° C., whereas the intermediate layer 117 is grown at a temperature from about 800° C. to about 900° C. As the intermediate layer 117 having a different composition from GaN is formed between the GaN layers 115, 119, stress can be induced to the n-type contact layer 119 on the intermediate layer 117, thereby providing improvement of crystal quality of the multi-quantum well structure.

The n-type contact layer 119 may be formed of Si-doped GaN. The n-type contact layer 119 may be grown on the intermediate layer 117, but is not limited thereto. Alternatively, the n-type contact layer 119 may be directly grown on the gallium nitride substrate 111, which has the pattern 113a of the dielectric material formed thereon. The first electrode 147 is formed on the n-type contact layer 119 to form ohmic contact therewith.

Figure 15:
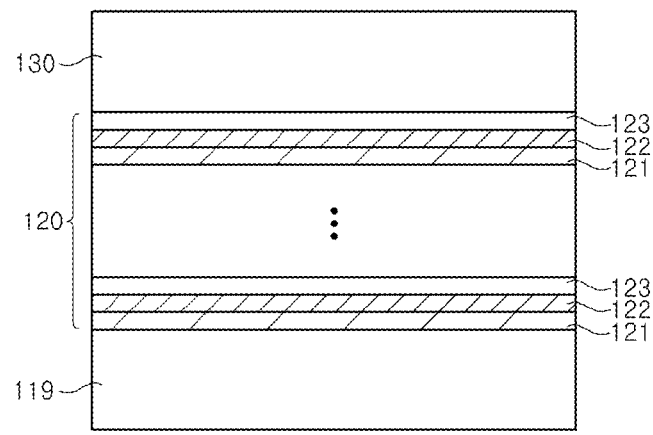
FIG. 15 is a sectional view of a super-lattice layer according to yet another embodiment of the present invention.

The super-lattice layer 120 of the multilayer structure may be disposed on the n-type contact layer 119. The super-lattice layer 120 is disposed between the n-type contact layer 119 and the active layer 130 and thus is disposed on a current path. The super-lattice layer 120 may be formed by repeatedly stacking pairs of InGaN/GaN in plural times (for example, 15 to 20 times), without being limited thereto. For example, as shown in FIG. 15, the super-lattice layer 120 may have a structure in which triple-layer structures of InGaN layer 121/AlGaN layer 122/GaN layer 123 are repeatedly stacked one above another in plural times (for example, about 10 to 20 times). The sequence of the AlGaN layer 122 and the InGaN layer 121 may be changed. Here, the InGaN layer 121 has a wider band-gap than the well layer in the active layer 130. Further, the AlGaN layer 122 preferably has a wider band-gap than the barrier layer in the active layer 130. Furthermore, the InGaN layer 121 and the AlGaN layer 122 may be undoped layers that do not contain impurities, and the GaN layer 123 may be a Si-doped layer. The uppermost layer of the super-lattice layer 120 is preferably a GaN layer 123 doped with impurities.

The AlGaN layer 122 included in the super-lattice layer 120 blocks holes from moving from the active layer 130 to the n-type contact layer 119, thereby improving recombination rate for generation of light from the active layer 130. The AlGaN layer 122 may have a thickness of less than 1 nm.

Figure 16:
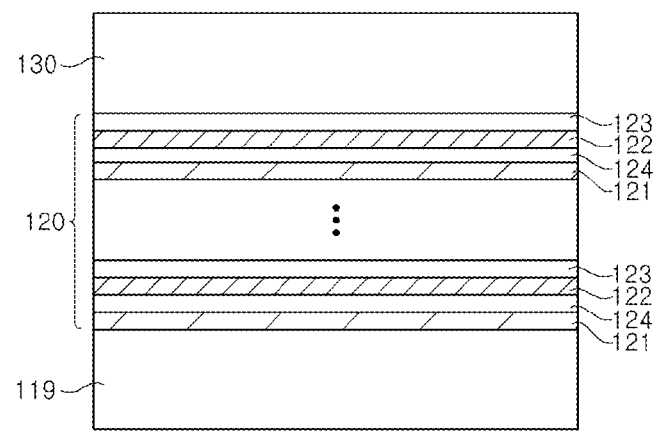
FIG. 16 is a sectional view of a super-lattice layer according to yet another embodiment of the present invention.

On the other hand, since the super-lattice layer 120 has the AlGaN layer 122 on the InGaN layer 121, crystal defects are likely to be formed at an interface therebetween due to large lattice mismatch therebetween. Accordingly, a GaN layer 124 may be interposed between the InGaN layer 121 and the AlGaN layer 122, as shown in FIG. 16. The GaN layer 124 may be an undoped layer or a Si doped layer.

The active layer 130 of the multi-quantum well structure is disposed on the super-lattice layer 120. As clearly shown in FIG. 17, the active layer 130 has a structure in which barrier layers 131a, 131b and well layers 133n, 133, 133p are alternately stacked one above another. Here, reference numeral 133n indicates a first well layer disposed closest to the super-lattice layer 120 or the n-type contact layer 119 and reference numeral 133p indicates a well layer (n-th well layer) disposed closest to the p-type clad layer 141 or the p-type contact layer 123. FIG. 18 shows an energy band of the active layer 130.

Figure 17:
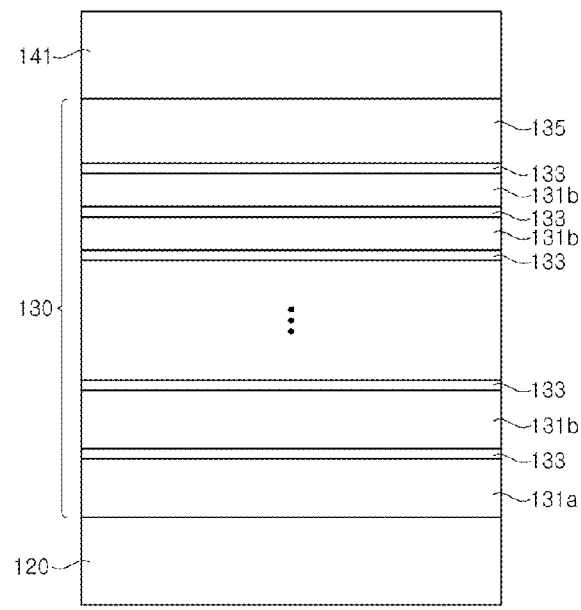
FIG. 17 is a sectional view of an active layer according to yet another embodiment of the present invention.
Figure 18:
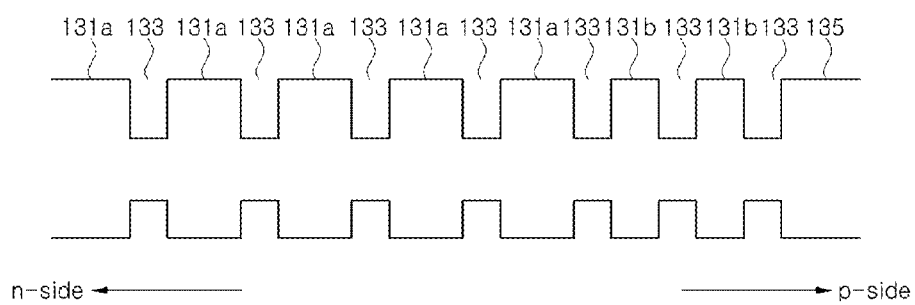
FIG. 18 shows an energy band of the active layer shown in FIG. 16.

Referring to FIGS. 17 and 18, a plurality of (n−1) barrier layers 131a, 131b and a plurality of (n−2) well layers 133 are alternately stacked one above another between the well layer 133n and the well layer 133p. The barrier layers 131a have a higher thickness than an average thickness of the plurality of (n−1) barrier layers 131a, 131b, and the barrier layers 131b have a lower thickness than the average thickness. Further, as shown, the barrier layers 131a are disposed near the first well layer 133n and the barrier layers 131b are disposed near the n-th well layer 133p.

In addition, the barrier layer 131a may be disposed while adjoining the uppermost layer of the super-lattice layer 120. That is, the barrier layer 131a may be disposed between the super-lattice layer 120 and the first well layer 133n. Further, a barrier layer 135 may be disposed on the n-th well layer 133p. The barrier layer 135 may have a higher thickness than the barrier layer 131a.

As the barrier layers 131b disposed near the n-th well layer 133p have a relatively low thickness, the light emitting diode can reduce resistance in the active layer 130 while allowing holes shifted from the p-type contact layer 143 to disperse towards the well layers 133 in the active layer 130, thereby reducing forward voltage of the light emitting diode. Further, as the barrier layer 135 has a relatively high thickness, crystal defects generated during growth of the active layer 130, particularly, during growth of the well layers 133n, 133, 133p, can be relieved, thereby improving crystal quality of the epitaxial layers formed thereon. However, when the number of barrier layers 131b is greater than the number of barrier layers 131a, luminous efficacy of the light emitting diode can be deteriorated due to increase in defect density within the active layer 130. Thus, it is desirable that the number of barrier layers 131a be greater than the number of barrier layers 131b.

On the other hand, the well layers 133n, 133, 133p may have substantially the same thickness, whereby the active layer can generate light having a very narrow full width at half maximum. In other embodiments, the well layers 133n, 133, 133p may be formed to different thicknesses to emit light having a relatively wide full width at half maximum. Furthermore, the well layer 133 disposed between the barrier layers 131b may be formed to a lower thickness than the well layer 133 disposed between the barrier layers 131a to prevent generation of crystal defects. For example, the well layers 133n, 133, 133p may have a thickness ranging, for example, from 10 Å to 30 Å; the barrier layers 131a may have a thickness ranging, for example, from 50 Å to 70 Å; and the barrier layers 131b may have a thickness ranging, for example, from 30 Å to 50 Å.

Further, the well layers 133n, 133, 133p may be formed as gallium nitride-based layers emitting near UV light or blue light. For example, the well layers 133n, 133, 133p may be formed of InGaN and the indium content thereof may be adjusted according to desired wavelengths.

On the other hand, the barrier layers 131a, 131b are formed as gallium nitride-based layers having a wider band gap than the well layers 133n, 133, 133p in order to confine electrons and holes in the well layers 133n, 133, 133p. For example, the barrier layers 131a, 131b may be formed of GaN, AlGaN or AlInGaN. Particularly, the barrier layers 131a, 131b may be formed as Al-containing gallium nitride-based layers to increase the band-gap. In the barrier layers 131a, 131b, the Al content ratio may be greater than 0 and less than 0.1, particularly, in the range from 0.02 to 0.05. Within this range of the Al content ratio, the light emitting diode can increase light output.

In addition, although not shown, a cap layer may be formed between each of the well layers 133n, 133, 133p and each of the barrier layers 131a, 131b disposed thereon. The cap layers are formed to prevent damage to the well layers in the course of increasing chamber temperature for growth of the barrier layer 131a, 131b. For example, the well layers 133n, 133, 133p may be grown at about 780° C. and the barrier layers 131a, 131b may be grown at about 800° C.

The p-type clad layer 141 is disposed on the active layer 130 and may be formed of AlGaN. Alternatively, the p-type clad layer 141 may have a super-lattice structure in which InGaN/AlGaN layers are repeatedly stacked one above another. The p-type clad layer 141 is an electron blocking layer and improves luminous efficacy by blocking electrons from shifting into the p-type contact layer 143.

Referring to FIG. 12 again, the p-type contact layer 143 may be formed of Mg-doped GaN. The p-type contact layer 143 is disposed on the p-type clad layer 141. On the other hand, a transparent conductive layer 145 such as ITO or ZnO is formed on the p-type contact layer 143 to form ohmic contact with the p-type contact layer 143. The second electrode 149 is electrically connected to the p-type contact layer 143. The second electrode 149 may be connected to the p-type contact layer 143 through the transparent conductive layer 145.

On the other hand, the n-type contact layer 119 may be exposed by partially removing the p-type contact layer 143, the p-type clad layer 141, the active layer 130 and the super-lattice layer 120 through etching. The first electrode 147 is formed on the exposed n-type contact layer 119.

In this embodiment, the epitaxial layers 115 to 143 on the gallium nitride substrate 111 may be formed by MOCVD. TMAl, TMGa and TMIn may be used as sources of Al, Ga and In, respectively, and $NH_3$ may be used as a source of N. Further, $SiH_4$ may be used as a source of Si used as an n-type impurity and $Cp_2Mg$ may be used as a source of Mg used as a p-type impurity.

EXPERIMENTAL EXAMPLE 1

Figure 19A:
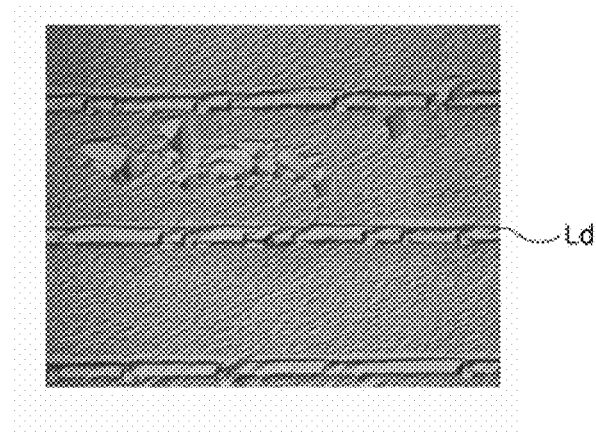
FIGS. 19a and 19b show optical micrographs of surface morphology of an epitaxial layer when an intermediate layer is formed.
Figure 19B:
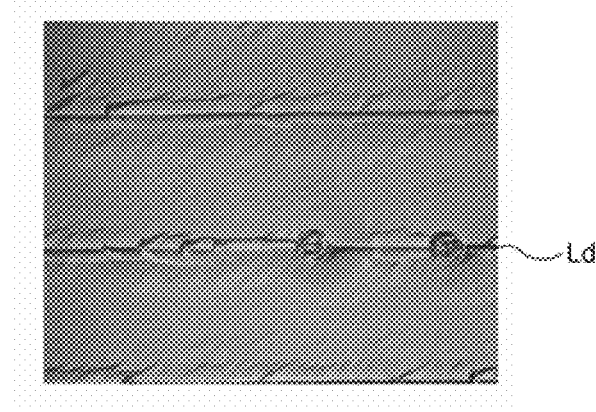

FIGS. 19a and 19b show optical micrographs of surface morphology of an epitaxial layer when an intermediate layer is formed. Herein, FIG. 19a is an optical micrograph of a surface of a p-type contact layer 143 after sequentially growing an n-type contact layer 119, a super-lattice layer 120, an active layer 130, a p-type clad layer 141 and the p-type contact layer 143 on a gallium nitride substrate 111 without forming the intermediate layer, and FIG. 19b is an optical micrograph of the surface of the p-type contact layer 143 after forming an $Al_{0.8}In_{0.2}N$ intermediate layer 117 having a thickness of less than 10 nm between the lower GaN layer 115 and the n-type contact layer 119, followed by sequentially forming the super-lattice layer 120, the active layer 130, the p-type clad layer 141 and the p-type contact layer 143 on the n-type contact layer 119. A c-plane growth substrate was used as the gallium nitride substrate 111, and the substrate 111 has dislocation lines Ld parallel to each other. The lower GaN layer 115 and the n-type contact layer 119 were grown at about 1050° C. to 1100° C. under the same conditions, and the intermediate layer 117 was grown at about 830° C.

Referring to FIG. 19a, when the intermediate layer 117 was not formed, the p-type contact layer 143 corresponding to the uppermost epitaxial layer had a very rough surface. The crystal defect lines Ld of the substrate 111 were transferred to the p-type contact layer 143 and observed even on the surface thereof. On the crystal defect lines Ld, the surface appeared poorer. Moreover, it could be confirmed that a region between the crystal defect lines Ld also had a very rough surface.

Referring to FIG. 19b, when the intermediate layer 117 was formed, it could be confirmed that the region between the crystal defect lines Ld had a very smooth surface and the epitaxial layer on the crystal defect lines Ld was very smoothly grown, as compared with FIG. 19a.

Further, light emitting diodes separated from each other were fabricated on the gallium nitride substrate 111 and compared with each other by application of forward voltage according to use of the intermediate layer 117 at wafer levels. As a result, forward voltage of the light emitting diodes fabricated using the intermediate layer 117 was generally about 0.13V less than that of the light emitting diodes fabricated without using the intermediate layer 117.

EXPERIMENTAL EXAMPLE 2

Figure 20:
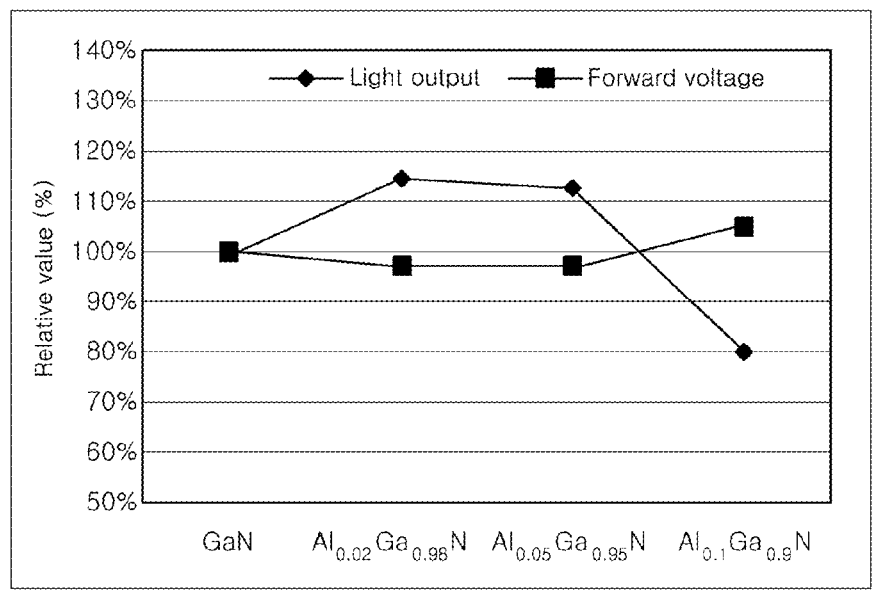
FIG. 20 is a graph depicting variation of light output and forward voltage depending on Al content ratio in a barrier layer.

FIG. 20 is a graph depicting variation of light output and forward voltage depending on Al content ratio in barrier layers of an active layer. Herein, a gallium nitride substrate was used as a growth substrate, the barrier layers were formed of AlGaN, and light output and forward voltage were measured while changing the Al content ratio. With reference to a light emitting diode including GaN barrier layers, a relative value of light output and forward voltage is represented as percent.

Referring to FIG. 20, in the light emitting diode including the AlGaN barrier layer, the Al content ratio of which ranges from 0.02 to 0.05, light output was increased 10% or more and forward voltage was slightly reduced, as compared with the light emitting diode using the GaN barrier layers. On the other hand, when the Al content ratio was increased to 0.1, the light emitting diode had reduced light output and increased forward voltage.

Therefore, it can be seen that, when the Al content ratio of the barrier layer is set in the range from about 0.02 to about 0.05, light output of the light emitting diode can be increased.

Figure 21:
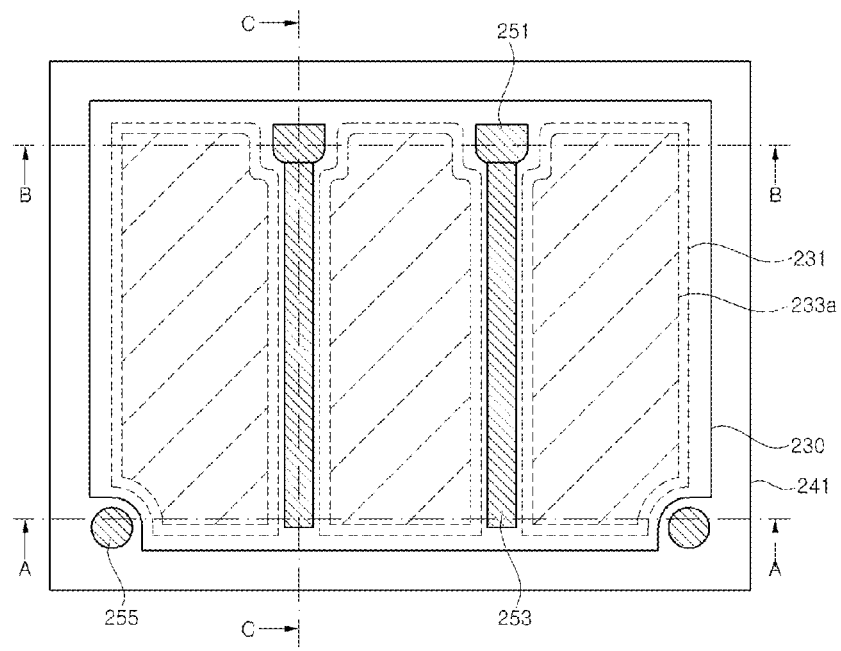
FIG. 21 is a schematic layout view of a light emitting diode according to one embodiment of the present invention.
Figure 22A:
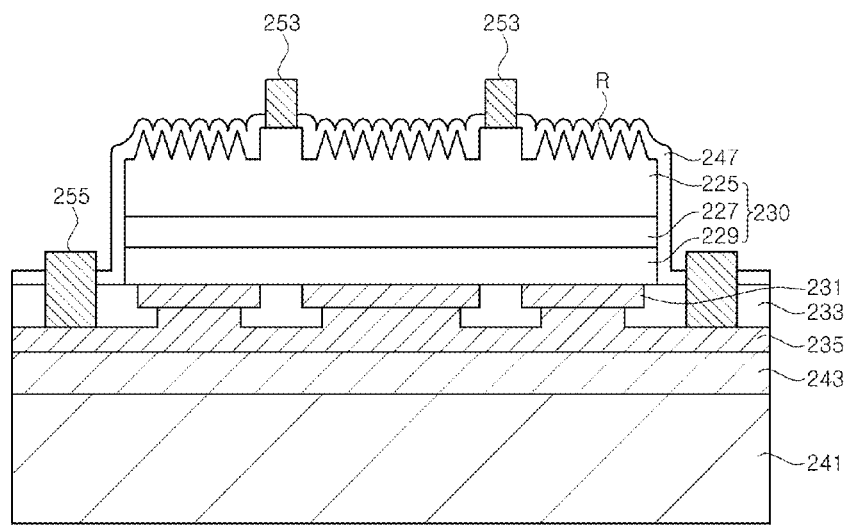
FIGS. 22a, 22b and 22c are sectional views taken along line A-A, B-B and C-C of FIG. 21, illustrating the light emitting diode according to the embodiment of the present invention.
Figure 22B:
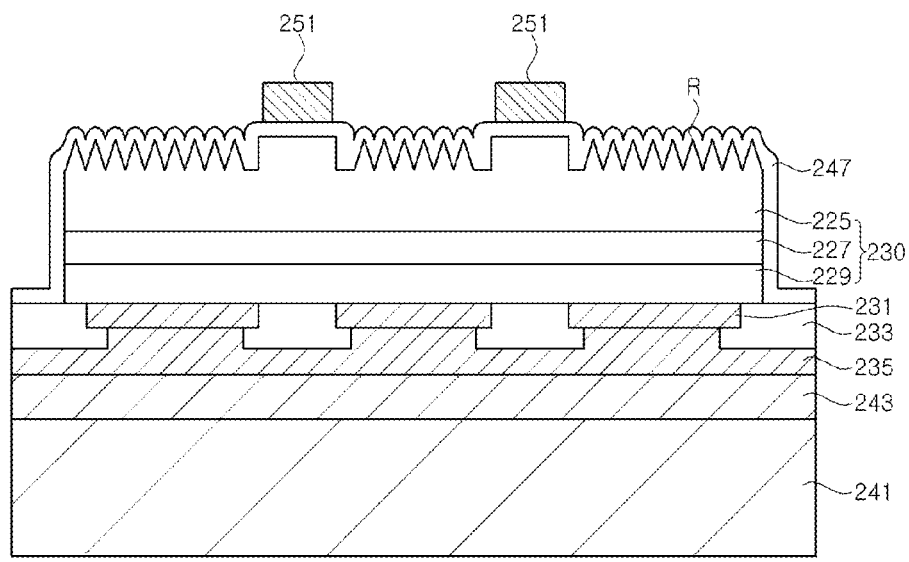
Figure 22C:
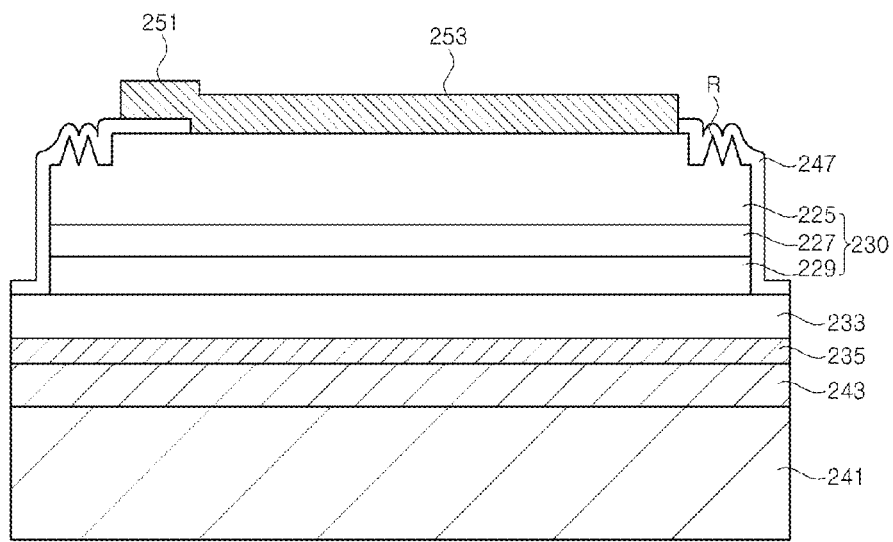
Figure 23:
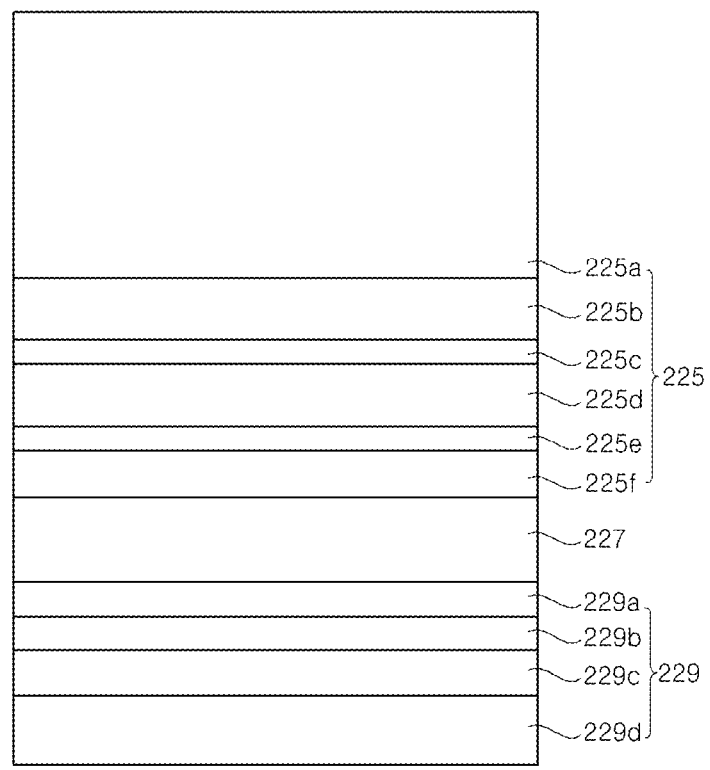
FIG. 23 is an enlarged sectional view of a semiconductor stack structure of the light emitting diode according to the embodiment of the present invention.
Figure 24:
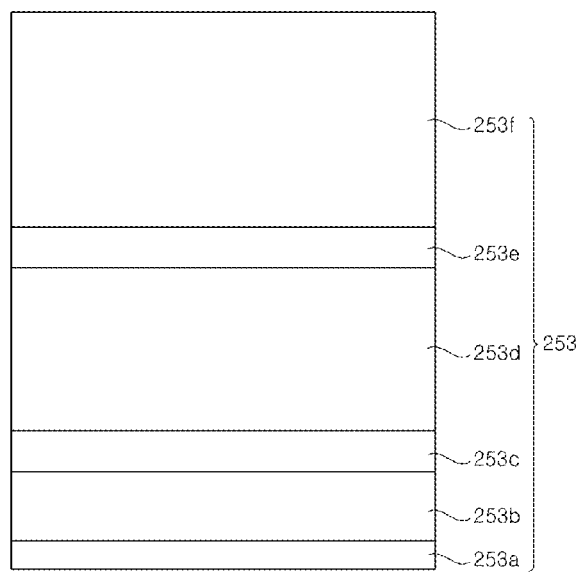
FIG. 24 is an enlarged sectional view of an electrode extension of the light emitting diode according to the embodiment of the present invention.

FIG. 21 is a layout view of a light emitting diode according to yet another embodiment of the present invention, and FIGS. 22a, 22b and 22c are sectional views taken along line A-A, B-B and C-C of FIG. 21, respectively. In addition, FIG. 23 is an enlarged sectional view of a semiconductor stack structure of the light emitting diode according to the embodiment of the present invention. In FIG. 21, a reflective metal layer 231 and an intermediate insulation layer 233 disposed under a semiconductor stack structure 230 are indicated by dotted lines. FIG. 24 is an enlarged sectional view of an electrode extension of the light emitting diode according to the embodiment of the present invention.

Referring to FIG. 21 to FIG. 24, the light emitting diode includes a support substrate 241, a semiconductor stack structure 230, a reflective metal layer 231, an intermediate insulation layer 233, a barrier metal layer 235, an upper insulation layer 247, an n-electrode pad 251, an electrode extension 253, and a p-electrode pad 255. In addition, the light emitting diode may include a bonding metal 243.

The support substrate 241 is different from a growth substrate for growth of compound semiconductor layers and is a secondary substrate attached to the grown compound semiconductor layers. The support substrate 241 may be an electrically conductive substrate, for example, a metal substrate or a semiconductor substrate, without being limited thereto. Alternatively, the support substrate 241 may be an insulating substrate such as a sapphire substrate. When the support substrate 241 is an electrically conductive substrate, the p-electrode pad 255 may be disposed under the support substrate 241 or may be omitted.

The semiconductor stack structure 230 is disposed on the support substrate 241, and includes a p-type compound semiconductor layer 229, an active layer 227 and an n-type compound semiconductor layer 225. Herein, like a general vertical type light emitting diode, the semiconductor stack structure 230 has the p-type compound semiconductor layer 229 disposed closer to the support substrate 241 than the n-type compound semiconductor layer 225. The semiconductor stack structure 230 may be disposed on some region of the support substrate 241. Specifically, the support substrate 241 has a wider area than the semiconductor stack structure 230 and the semiconductor stack structure 230 is disposed in a region surrounded by an edge of the support substrate 241.

The n-type compound semiconductor layer 225, the active layer 227 and the p-type compound semiconductor layer 229 may be formed of a group based compound semiconductor, for example, an (Al, Ga, In)N semiconductor. Each of the n-type compound semiconductor layer 225 and the p-type compound semiconductor layer 229 may include multiple layers, as shown in FIG. 23.

Namely, as shown in FIG. 23, the n-type compound semiconductor layer 225 may include an n-type contact layer 225a, a first recovery layer 225b, an electron replenishment layer 225c, a second recovery layer 225d, an electron injection layer 225e, and a super-lattice layer 225f. The n-type contact layer 225a is an n-type semiconductor layer to which external current is supplied, and may have a relatively high concentration, for example, in the range of 4~9 E18/$cm^3$. The n-type contact layer 225a may have a roughened surface and an overall thickness of the n-type contact layer 225a including the roughened surface may range from 4.5 μm to 10 μm. When the n-type contact layer 225a has a low thickness, the light emitting diode has low reliability due to current crowding. In addition, when the thickness of the n-type contact layer 225a exceeds 10 μm, the n-type contact layer has poor crystallinity, thereby causing increase in forward voltage of the light emitting diode.

On the other hand, the first recovery layer 225b adjoins the n-type contact layer 225a and may be an undoped layer or a lightly doped layer with a lower concentration than that of the n-type contact layer 225a. The first recovery layer 225b obstructs electrons from moving in a vertical direction to assist in current spreading in the n-type contact layer 225a. The first recovery layer 225b is preferably formed to a higher thickness than the thickness that allows tunneling of electrons therethrough. However, excessive thickness of the first recovery layer can cause increase in forward voltage. Thus, the first recovery layer 225b may have a thickness of 100 nm to 200 nm.

The electron replenishment layer 225c is disposed between the first recovery layer 225b and the second recovery layer 225d having relatively high specific resistance and relieves increase in forward voltage of the light emitting diode by replenishing electrons. The electron replenishment layer 225c has a higher doping concentration than the first recovery layer 225b and a lower thickness than the first recovery layer 225b. For example, the electron replenishment layer 225c may have a thickness of 10 nm to 20 nm.

Like the first recovery layer 225b, the second recovery layer 225d may be an undoped or lightly doped layer and may have a thickness of 100 nm to 200 nm. In addition to the first recovery layer 225b, the second recovery layer 225d is formed to improve crystallinity of the active layer 227 and may be omitted, as needed.

The electron injection layer 225e is formed for injection of electrons into the active layer 227 and is a heavily doped layer like the n-type contact layer 225a. The electron injection layer 225e may have a thickness of, for example, 10 nm to 30 nm.

The super-lattice layer 225f is formed to relieve stress induced by the n-type contact layer 225a having a relatively high thickness. The super-lattice layer 225f may be formed by alternately stacking (In)GaN layers having different compositions.

The active layer 227 may have a single quantum well structure or a multi-quantum well structure. For example, the active layer 227 may have a multi-quantum well structure in which barrier layers and well layers are alternately stacked one above another. Here, the barrier layers may be formed of GaN or InGaN and the well layers may be formed of InGaN.

The p-type compound semiconductor layer 229 may include an electron blocking layer 229a, a hole injection layer 229b, an undoped or lightly doped layer 229c, and a p-type contact layer 229d. The p-type contact layer 229d is a semiconductor layer into which external current is supplied, and forms ohmic contact with the reflective metal layer 231. The electron blocking layer 229a serves to confine electrons in the active layer 227 and the hole injection layer 229b is a heavily doped layer for injection of holes into the active layer 227. The undoped or lightly doped layer 229c is formed to recover crystallinity, which is deteriorated by doping the hole injection layer 229b at high concentration, and assists in current spreading within the p-type contact layer 229d by obstructing movement of holes.

Referring to FIGS. 22a to 22c again, since the n-type compound semiconductor layer 225 having relatively low resistance is disposed at an opposite side of the support substrate 241, a roughened surface R can be easily formed on an upper surface of the n-type compound semiconductor layer 225. The roughened surface R improves extraction efficiency of light generated from the active layer 227.

P-electrodes 231, 235 are disposed between the p-type compound semiconductor layer 229 and the support substrate 241, and may include the reflective metal layer 231 and the barrier metal layer 235. The reflective metal layer 231 forms ohmic contact with the p-type compound semiconductor layer 229, that is, the p-type contact layer 229d, between the semiconductor stack structure 230 and the support substrate 241. The reflective metal layer 231 may include a reflective layer, for example, an Ag layer. The reflective metal layer 231 is disposed only under a region of the semiconductor stack structure 230. As shown in FIG. 21, the reflective metal layer 231 may be composed of plural plates, and grooves may be formed between the plural plates. The semiconductor stack structure 230 is exposed through the grooves.

The intermediate insulation layer 233 covers the reflective metal layer 231 between the reflective metal layer 231 and the support substrate 241. The intermediate insulation layer 233 may cover a side surface of the reflective metal layer 231, for example, side surfaces of the plural plates, and may also cover an edge thereof. The intermediate insulation layer 233 adjoins the surface of the semiconductor stack structure 230 exposed through the grooves of the reflective metal layer 231 to prevent current flow into the groove regions. The intermediate insulation layer 233 may be a single layer or multiple layers of silicon oxide or silicon nitride, or may be a distributed Bragg reflector (DBR), in which dielectric layers having different indices of refraction, for example, $SiO_2/TiO_2$ or $SiO_2/Nb_2O_5$, are repeatedly stacked. The intermediate insulation layer 233 may prevent the side surface of the reflective metal layer 231 from being exposed to the outside. In addition, the intermediate insulation layer 233 may be disposed under the side surface of the semiconductor stack structure 230, thereby preventing current leakage through the side surface of the semiconductor stack structure 230.

The barrier metal layer 235 is disposed between the reflective metal layer 231 and the support substrate 241 to cover the reflective metal layer 231. The barrier metal layer 235 protects the reflective metal layer 231 by preventing diffusion of a metallic material of the reflective metal layer 231, for example, Ag. The barrier metal layer 235 may include, for example, a Ni layer. The barrier metal layer 235 may be disposed to cover the intermediate insulation layer 233 under the intermediate insulation layer 233, and may be disposed on the overall surface of the support substrate 241.

The support substrate 241 may be bonded to the barrier metal layer 235 via the bonding metal 243. The bonding metal 243 may be formed of, for example, Au—Sn by eutectic bonding. Alternatively, the support substrate 241 may be formed on the barrier metal layer 235 by plating. When the support substrate 241 is an electrically conductive substrate, the support substrate 241 can act as the p-electrode pad. On the contrary, when the support substrate 241 is an insulation substrate, the p-electrode pad 255 may be formed on the barrier metal layer 235, which is disposed on the support substrate 241.

The upper surface of the semiconductor stack structure 230, that is, the surface of the n-type compound semiconductor layer 225, may have the roughened surface R and a flat surface. As shown in FIGS. 22a to 22c, the n-electrode pad 251 and the electrode extension 253 are disposed on the flat surface. As shown, the n-electrode pad 251 and the electrode extension 253 may be disposed only on the flat surface and have narrower widths than that of the flat surface. With this structure, it is possible to prevent separation of the electrode pad or the electrode extension due to occurrence of undercut or the like in the semiconductor stack structure 230, thereby improving reliability of the light emitting diode. The roughened surface R may be disposed slightly beneath the flat surface. That is, the roughened surface R may be disposed beneath the electrode pads 251 and the electrode extensions 253.

The n-electrode pad 251 is disposed on the semiconductor stack structure 230 and the electrode extension 253 extends from the n-electrode pad 251. A plurality of n-electrode pads 251 may be disposed on the semiconductor stack structure 230 and the electrode extension 253 may extend from each of the n-electrode pads 251. The electrode extension 253 is electrically connected to the semiconductor stack structure 230 and may directly contact the n-type compound semiconductor layer 225, that is, the n-type contact layer 225a.

The n-electrode pads 251 may also be disposed above the groove regions of the reflective metal layer 231. That is, under the n-electrode pads 251, the intermediate insulation layer 233 is disposed instead of the reflective metal layer 231 forming ohmic contact with the p-type compound semiconductor layer 229. In addition, the electrode extensions 253 are also disposed above the groove regions of the reflective metal layer 231. As shown in FIG. 21, each of the electrode extensions 253 may be disposed above the region between the plates of the reflective metal layer 231 composed of the plurality of plates. Preferably, the groove region of the reflective metal layer 231, for example, the region between the plural plates, has a greater width than the width of the electrode extension 253. This structure can prevent current crowding directly under the electrode extension 253.

The electrode extension 253 may composed of multiple layers as shown in FIG. 24.

That is, as shown in FIG. 24, the electrode extension 253 may comprise ab ohmic layer which includes a first Ni layer 253a, an Al layer 253b and a second Ni layer 253c, and a pad layer which includes a first Au layer 253d, a Cr layer 253e and a second Au layer 253f. The first Ni layer 253a of the ohmic layer is disposed on the n-type compound semiconductor layer 225, preferably, while contacting the n-type compound semiconductor layer 225. The first Ni layer 253a allows the electrode extension 253 to form ohmic contact with the n-type compound semiconductor layer 225, the second Ni layer 253c contacts the pad layer disposed on the ohmic layer, that is, the first Au layers 253d, and the Al layer 253b acts as a barrier layer that prevents interdiffusion of materials between the first Ni layer 253a and the second Ni layer 253c, or from upper or lower layers of the first Ni layer 253a and the second Ni layer 253c.

The pad layer has a high thickness. Considering electrical conductivity, the pad layer may be provided as Au layers including Au. Here, since there can be a problem of peeling or the like when the Au layers are thickly deposited to a thickness of, for example, 2 μm, by E-beam or the like, a deformation relieving layer may be provided to prevent such problems. Thus, as shown in FIG. 24, the pad layer include the first Au layers 253d and the second Au layers 253f, and may further include the Cr layer 253e between the first Au layers 253d and the second Au layers 253f as the deformation relieving layer.

Here, in the electrode extension 253, the first Ni layer 253a may have a thickness of 20 Å to 100 Å, the Al layer 253b may have a thickness of 1000 Å to 5000 Å, the second Ni layer 253c may have a thickness of 100 Å to 500 Å, the first Au layers 253d may have a thickness of 1 μm to 5 μm, the Cr layer 253e may have a thickness of 100 Å to 500 Å, and the second Au layers 253f may have a thickness of 1 μm to 5 μm. Preferably, the first Ni layer 253a has a thickness of 50 Å, the Al layer 253b has a thickness of 2000 Å, the second Ni layer 253c has a thickness of 200 Å, the first Au layers 253d has a thickness of 2 μm, the Cr layer 253e has a thickness of 200 Å, and the second Au layers 253f has a thickness of 2 μm.

Therefore, the electrode extension 253 includes the first Ni layer 253a of the ohmic layer to reduce operating voltage by reducing ohmic resistance between the ohmic layer and the n-type compound semiconductor layer 225 of the semiconductor stack structure 230. Further, in the electrode extension 253, the Au layers 253d, 53f of the pad layer are formed to a thickness of 2 μm to 10 μm, preferably 4 μm, to allow efficient current flow by reducing internal resistance of the pad layer, that is, to allow efficient current flow in a horizontal direction of the electrode extension 253, such that the current can uniformly flow on the overall surface of the n-type compound semiconductor layer 225 of the semiconductor stack structure 230, thereby improving current spreading.

Although not shown in FIG. 24, the n-electrode pad 251 connected to the electrode extension 253 may have the same structure as that of the electrode extension 253. That is, the n-electrode pad 251 may also include the same layers as the ohmic layer, which include the first Ni layer 253a, the Al layer 253b and the second Ni layer 253c, and the pad layer, which includes the first Au layers 253d, the Cr layer 253e and the second Au layer 253f. Here, since the n-electrode pads 251 do not form ohmic contact at a lower side thereof, the ohmic layers can be omitted.

The upper insulation layer 247 is interposed between the n-electrode pad 251 and the semiconductor stack structure 230. The upper insulation layer 247 prevents direct current flow from the n-electrode pad 251 to the semiconductor stack structure 230, and, particularly, can prevent current crowding directly under the n-electrode pads 251. In addition, the upper insulation layer 247 covers the roughened surface R. Here, the upper insulation layer 247 may have a convex-concave surface formed along the roughened surface R. The convex-concave surface of the upper insulation layer 247 may include protrusions. The convex-concave surface of the upper insulation layer 247 can reduce total internal reflection on the upper surface of the upper insulation layer 247.

In addition, the upper insulation layer 247 covers the side surface of semiconductor stack structure 230 to protect the semiconductor stack structure 230 from an external environment. Further, the upper insulation layer 247 may have an opening through which the semiconductor stack structure 230 is exposed, and the electrode extension 253 may be disposed in the opening to contact the semiconductor stack structure 230.

FIGS. 25 to 30 are sectional views illustrating a method of manufacturing the light emitting diode according to the embodiment of the present invention. Here, FIG. 25a is a sectional view of the light emitting diode after growth of semiconductor layers on a substrate 221 and FIG. 25b is an enlarged sectional view of the semiconductor layers. These sectional views are taken along line A-A of FIG. 21.

Figure 25A:
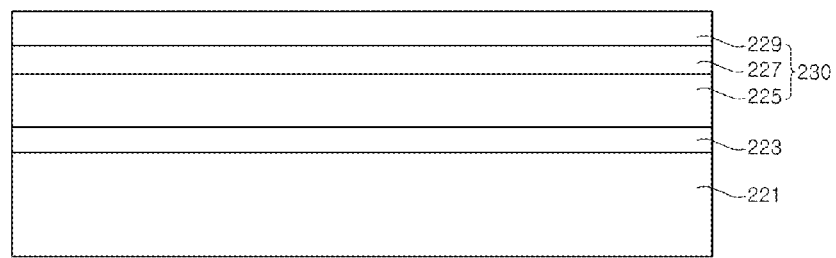
Figure 25B:
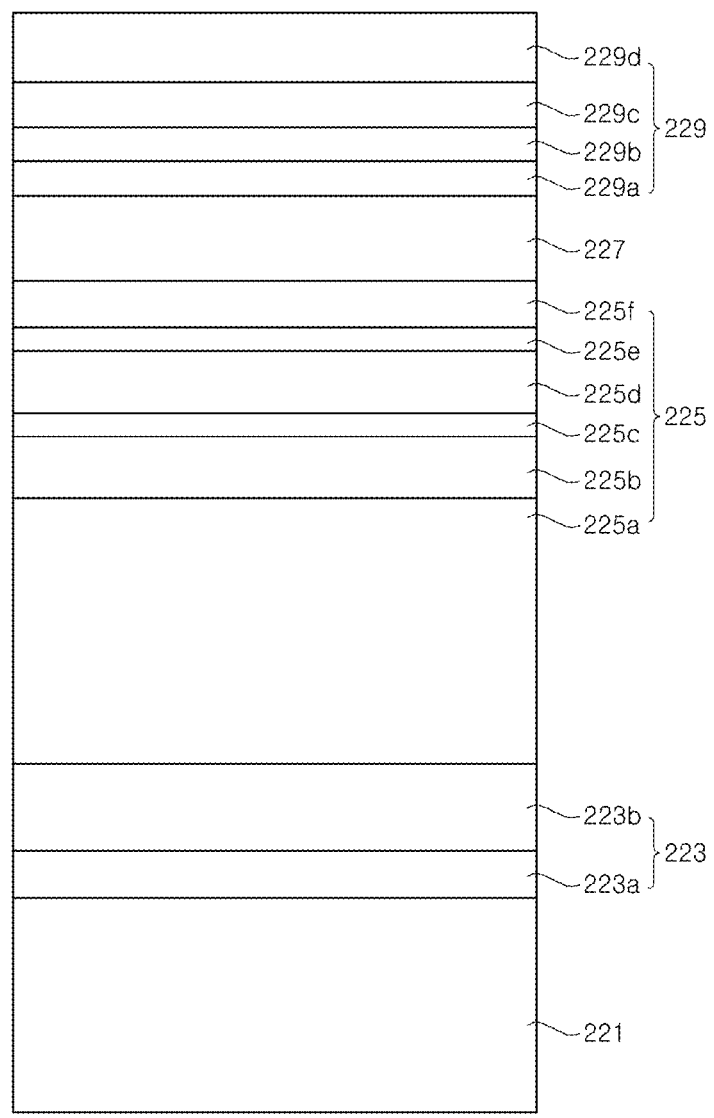

Referring to FIGS. 25a and 25b, a buffer layer 223 is formed on a growth substrate 221, and a semiconductor stack structure 230 including an n-type semiconductor layer 225, an active layer 227 and a p-type semiconductor layer 229 is formed thereon. The growth substrate 221 may be a sapphire substrate, but is not limited thereto. Alternatively, the growth substrate 221 may be a different type of substrate, for example, a silicon substrate. Each of the n-type and p-type semiconductor layers 225, 229 may include multiple layers, as shown in FIG. 24b. Further, the active layer 227 may have a single quantum well structure or a multi-quantum well structure.

The buffer layer 223 may include a nucleation layer 223a and a high temperature buffer layer 223b. The nucleation layer 223a may be formed of a gallium nitride-based material, such as gallium nitride or aluminum nitride. Further, the high temperature buffer layer 223b may be formed of, for example, undoped GaN.

Further, as shown in FIG. 23, the n-type semiconductor layer 225 may include an n-type contact layer 225a, a first recovery layer 225b, an electron replenishment layer 225c, a second recovery layer 225d, an electron injection layer 225e, and a super-lattice layer 225f. The n-type contact layer 225a, the first recovery layer 225b, the electron replenishment layer 225c, the second recovery layer 225d and the electron injection layer 225e may be formed of, for example, GaN, and the super-lattice layer 225f may be formed of, for example, GaN/InGaN or InGaN/InGaN. On the other hand, the p-type semiconductor layer 229 may include an electron blocking layer 229a, a hole injection layer 229b, an undoped or lightly doped layer 229c, and a p-type contact layer 229d. The electron blocking layer 229a may be formed of AlGaN, and the hole injection layer 229b, the undoped or lightly doped layer 229c and the p-type contact layer 229d may be formed of, for example, GaN. The first recovery layer 225b is formed to recover crystallinity, which can be deteriorated due to a relatively high thickness of the n-type contact layer 225a doped at high concentration.

The compound semiconductor layers may be formed of Group III-N based compound semiconductors formed on the growth substrate 221 by metal-organic chemical vapor deposition (MOCVD), molecular beam epitaxy (MBE), or the like.

Figure 26:
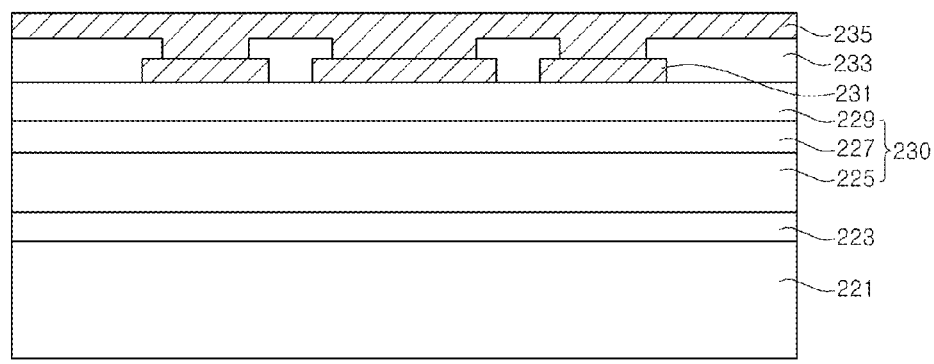

Referring to FIG. 26, a reflective metal layer 231 is formed on the semiconductor stack structure 230. The reflective metal layer 231 has grooves through which the semiconductor stack structure 230 is exposed. For example, the reflective metal layer 231 may be composed of plural plates and the grooves may be formed between the plural plates (see FIG. 21).

Then, an intermediate insulation layer 233 is formed to cover the reflective metal layer 231. The intermediate insulation layer 233 may fill the grooves in the reflective metal layer and cover a side surface and an edge of the reflective metal layer. Further, the intermediate insulation layer 233 has openings, through which the reflective metal layer 231 is exposed. The intermediate insulation layer 233 may be a silicon oxide layer or a silicon nitride layer, or may be a distributed Bragg reflector (DBR) in which dielectric layers having different indices of refraction are repeatedly stacked.

A barrier metal layer 235 is formed on the intermediate insulation layer. The barrier metal layer 235 may be connected to the reflective metal layer 231 by filling the openings formed in the intermediate insulation layer 233.

Figure 27:
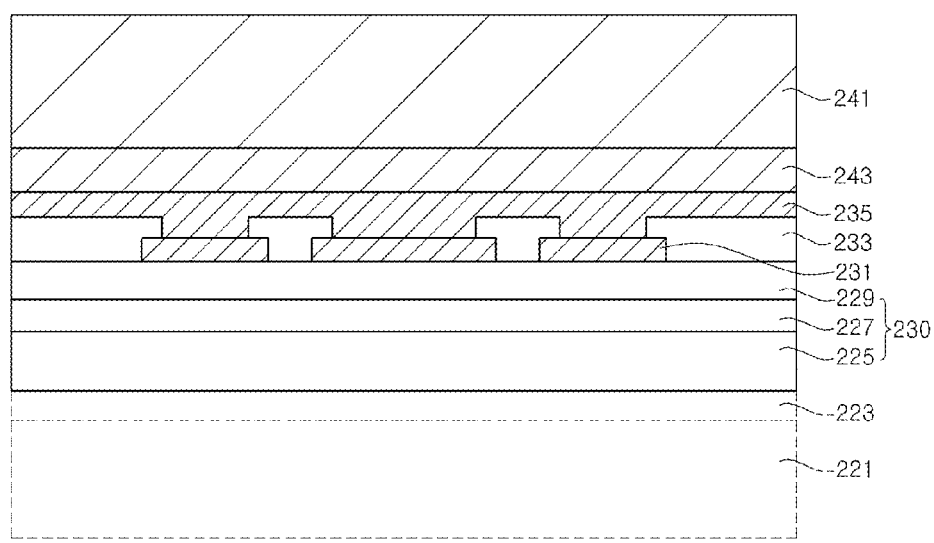

Referring to FIG. 27, a support substrate 241 is attached to an upper side of the barrier metal layer 235. The support substrate 241 is prepared independently of the semiconductor stack structure 230 and may be bonded onto the barrier metal layer 235 via a bonding metal 243. Alternatively, the support substrate 241 may be formed on the barrier metal layer 235 by plating.

Then, the growth substrate 221 is removed. The growth substrate 221 may be removed by laser lift-off (LLO). After the growth substrate 221 is removed, the buffer layer 223 is removed, whereby the surface of the n-type semiconductor layer 225 of the semiconductor stack structure 230 is exposed.

Figure 28:
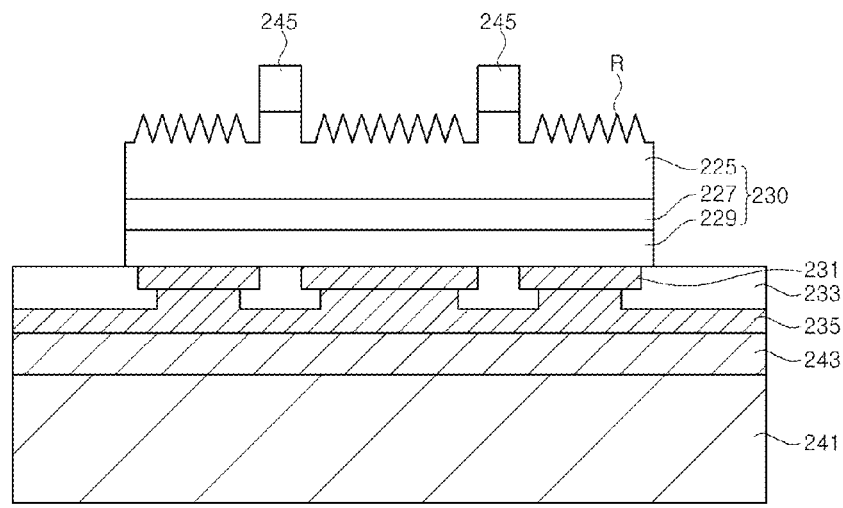

Referring to FIG. 28, a mask pattern 245 is formed on the exposed n-type semiconductor layer 225. The mask pattern 245 covers regions of the n-type semiconductor layer 225 corresponding to the grooves of the reflective metal layer 231 while exposing other regions thereof. Particularly, the mask pattern 245 covers regions in which an n-electrode pad and an electrode extension will be formed. The mask pattern 245 may be formed of the same polymer as that of a photoresist.

Then, the surface of the n-type semiconductor layer 225 is subjected to anisotropic etching using the mask as an etching mask to form a roughened surface R on the n-type semiconductor layer 225. Next, the mask pattern 245 is removed. The surface of the n-type semiconductor layer 225, on which the mask pattern 245 is disposed, maintains a flat surface.

On the other hand, the semiconductor stack structure 230 is subjected to patterning to form a chip division region while exposing the intermediate insulation layer 233. The chip division region may be formed before or after formation of the roughened surface (R).

Figure 29:
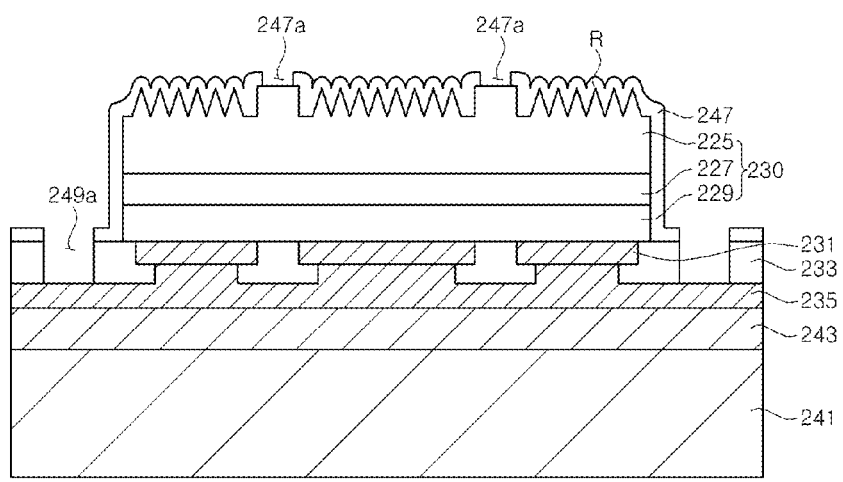

Referring to FIG. 29, an upper insulation layer 247 is formed on the n-type semiconductor layer 225 having the roughened surface R formed thereon. The upper insulation layer 247 has a convex-concave surface formed along the roughened surface R and corresponding to the roughened surface R. The upper insulation layer 247 covers a flat surface on which n-electrode pads 251 will be formed. The upper insulation layer 247 may also cover the side surface of the semiconductor stack structure 230 exposed to the chip division region. The upper insulation layer 247 has openings 247a exposing a flat surface on which electrode extensions 253 will be formed. In addition, openings 249a are formed in the upper insulation layer 247 and the intermediate insulation layer 233, and the barrier metal layer 235 may be exposed through the openings 249a. When the support substrate 241 is an electrically conductive substrate, the process of forming the openings 249a can be omitted.

Then, the n-electrode pads 251 are formed on the upper insulation layer 247, the electrode extensions are formed in the openings 247a, and p-electrode pads 255 are formed in the openings 249a. The electrode extension extends from each of the n-electrode pads 251 and is electrically connected to the semiconductor stack structure 230.

Then, individual chips are divided along the chip division region, thereby providing light emitting diodes (see FIG. 22a).

Figure 30:
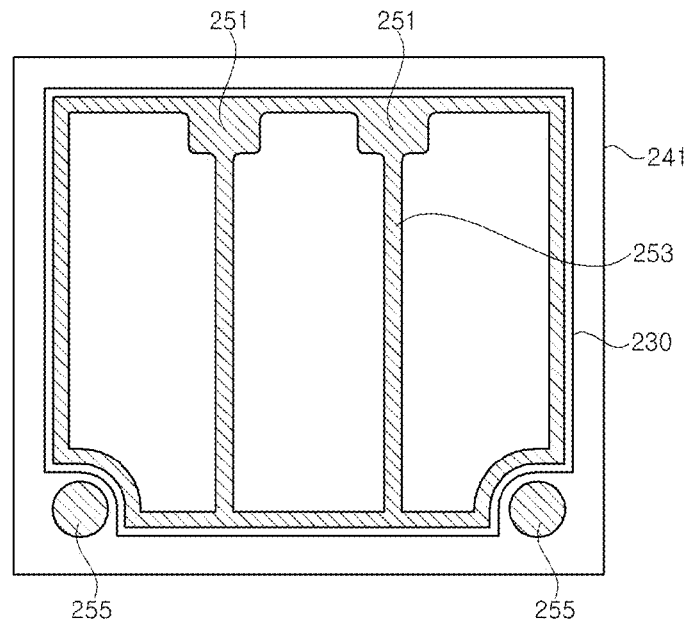
FIG. 30 is a schematic layout view of a light emitting diode according to yet another embodiment of the present invention.

FIG. 30 is a schematic layout view of a light emitting diode according to yet another embodiment of the present invention.

Referring to FIG. 30, the light emitting diode according to this embodiment is similar to the light emitting diode described with reference to FIGS. 21, 22a, 22b, 22c, 23 and 24 except that the electrode extensions 253 are further disposed along an edge of the semiconductor stack structure 230. As a result, the electrode extensions 253 of FIG. 1 are electrically connected to each other.

Under the electrode extensions 253 in a vertical direction, the reflective metal layer 231 forming ohmic contact with the p-type semiconductor layer 229 is not formed, and the intermediate insulation layer 233 is disposed on the p-type semiconductor layer 229.

According to this embodiment, the electrode extensions are further disposed along the edge of the semiconductor stack structure 230, thereby further improving current spreading performance.

Figure 31A:
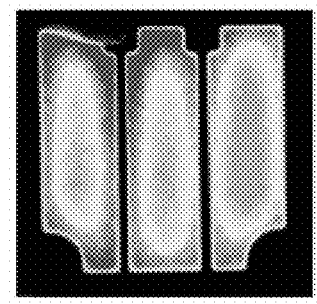
FIGS. 31a and 31b are pictures showing relationships between a luminous pattern and thickness of an n-type semiconductor layer.
Figure 31B:
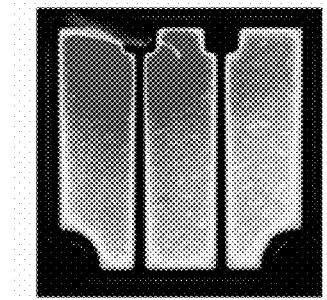

FIG. 31 is a picture showing relationship between a luminous pattern and thickness of the n-type semiconductor layer 225. Here, FIG. 31a is a picture of a luminous pattern when the n-type contact layer 225a had a thickness of about 3.5 μm (Comparative Example) and FIG. 31b is a picture of a luminous pattern when the n-type contact layer 225a had a thickness of about 5 μm (Example). Except for these conditions, light emitting diodes having a size of 1200 μm×1200 μm were fabricated under the same conditions, in which the electrode extensions 253 as shown in FIG. 30 were formed.

In FIG. 31a, it can be seen that light was generally emitted from regions near the electrode extensions and a central region surrounded by the electrode extensions had relatively low light output. On the contrary, in FIG. 31b, it can be seen that there was no significant difference between the central region surrounded by the electrode extensions and the regions near the electrode extensions.

On the other hand, the light emitting diodes were evaluated as to light output reliability over time upon application of an accelerating current of 700 mA, and test results are shown in Table 1. Light output was measured at a current of 350 mA and output reduction is represented in percent with reference to light output before measurement of accelerating current. Under a measurement condition of 350 mA, there was no difference in light output before measurement of accelerating current between Comparative Example and Example.

Figure 32:
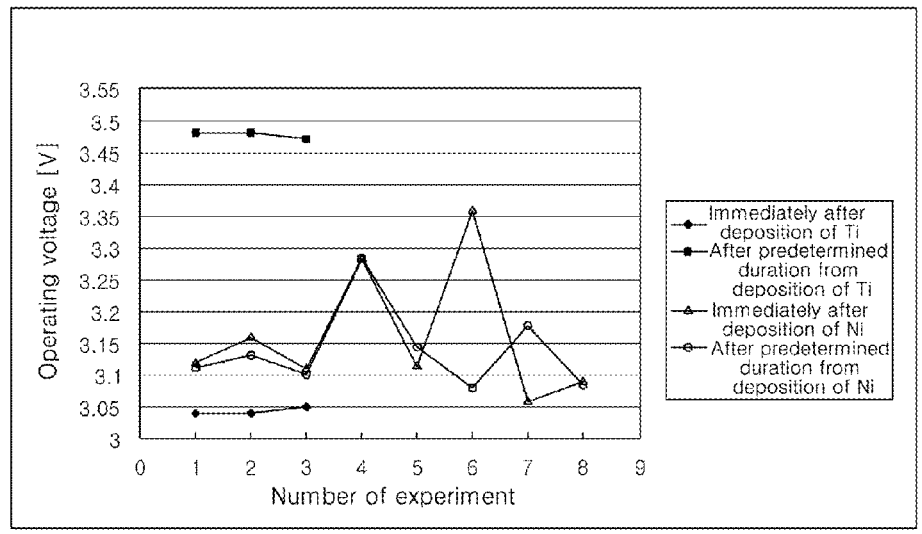
FIG. 32 is a graph depicting variation of operating voltage upon formation of a Ti layer or a Ni layer in an n-electrode pad or in an ohmic layer of an electrode extension.

Here, graph lines of FIG. 32 show operating voltages of the light emitting diode (Example), in which the first Ni layer 253a and the second Ni layer 253c of the ohmic layer of the electrode extensions 253 or the n-electrode pads 251 and the electrode extensions 253 include Ni layers, that is, in which the ohmic layer includes a Ni layer/Al layer/Ni layer/Au layer, and show operating voltages of the light emitting diode (Comparative Example), in which the ohmic layer includes Ti layers, that is, Ti layer/Al layer/Ti layer/Au layer.

Here, the expression "immediately after deposition of Ti" means operating voltage of the light emitting diode immediately after formation of the Ti layers, the expression "after predetermined duration from deposition of Ti" means operating voltage of the light emitting diode when a relatively long period of time passes after formation of the Ti layers, the expression "immediately after deposition of Ni" means operating voltage of the light emitting diode immediately after formation of the Ni layers, and the expression "after predetermined duration from deposition of Ni" means operating voltage of the light emitting diode when a relatively long period of time passes after formation of the Ni layers.

In the graph of FIG. 32, it could be seen that, when the ohmic layer included the Ti layers as in Comparative Example, the light emitting diode had a low operating voltage immediately after fabrication of the light emitting diode, that is, "immediately after deposition of Ti". Then, deterioration in operating characteristics was observed since the operating voltage of the light emitting diode was increased about 14% or more after operation for a predetermined period of time, that is, "after predetermined duration from deposition of Ti".

TABLE 1

| Sample | Accelerating current | Measurement current | Time | | | | |
| --- | --- | --- | --- | --- | --- | --- | --- |
| | | | 24 Hr | 250 Hr | 500 Hr | 750 Hr | 1000 Hr |
| Comparative Example | 700 mA | 350 mA | −7.5% | −12.5% | −12.2% | −12.7% | −13.6% |
| Example | 700 mA | 350 mA | −3.7% | −6.5% | −6.0% | −6.0% | −6.9% |

Referring to Table 1, the light emitting diodes of both Example and Comparative Example exhibited a tendency of decreasing light output upon application of accelerating current. However, it can be seen that the light emitting diode of Example exhibited much slower reduction in light output than the light emitting diode of Comparative Example, and that the reduction in light output of the light emitting diode of Comparative Example was about two times that of the light emitting diode of Example after lapse of the same period of time.

From this result, it can be confirmed that increase in thickness of the n-type contact layer improves reliability of a light emitting diode, and it is anticipated that such a result is caused by improvement in current spreading performance.

FIG. 32 is a graph depicting variation of operating voltage upon formation of a Ti layer or a Ni layer in an n-electrode pad or in an ohmic layer of an electrode extension.

FIG. 32 shows a graph of operating voltage of a light emitting diode, which had a structure similar to that of the light emitting diode described with reference to FIG. 21, FIGS. 22a, 22b, 22c, 23 and 24, and was fabricated without the p-electrode pad 255. Further, the support substrate 241 acts as the p-electrode pad, that is, a p-electrode, and the pad layer is simplified using an Au layer.

On the contrary, it could be seen that, when the ohmic layer included the Ni layers as in Example, there was generally less variation in operating voltage of the light emitting diode between immediately after fabrication of the light emitting diode, that is, "immediately after deposition of Ni" and after operation of the light emitting diode for a predetermined period of time, that is, "after predetermined duration from deposition of Ni", particularly, as compared with that of the light emitting diode in which the ohmic layer included Ti.

From this result, it could be seen that the operating voltage of the light emitting diode of Comparative Example increased over time due to increase in ohmic resistance by reaction between the Ti layers and the Al layer over time, whereas the operating voltage of the light emitting diode of Example exhibited substantially no variation since characteristics of the ohmic layer including the Ni layers 253a, 253c and the Al layer 253b did not change over time or with change in temperature.

Figure 33:
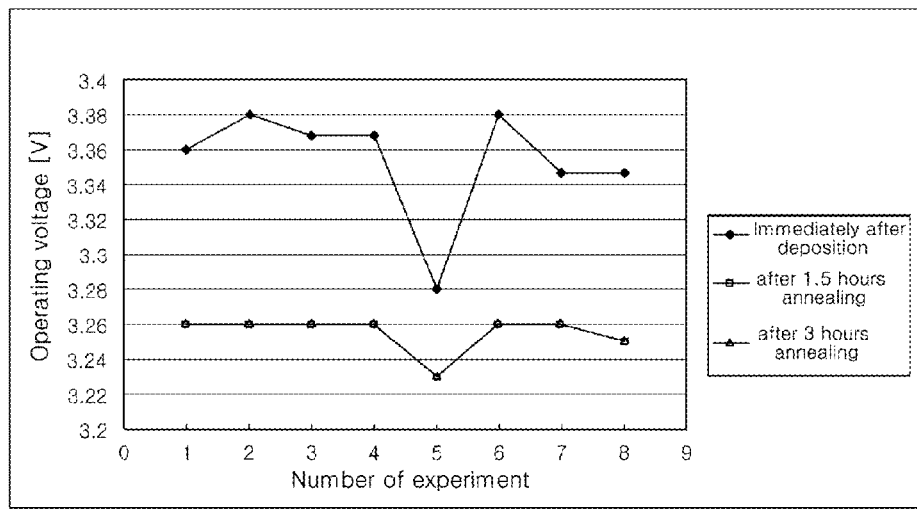
FIG. 33 is a graph depicting operating voltage drops upon annealing of the n-electrode pad or the electrode extension.

FIG. 33 is a graph depicting operating voltage drop upon annealing of the n-electrode pad or the electrode extension.

Graph lines of FIG. 33 show operating voltages of a light emitting diode, which had a structure similar to that of the light emitting diode of FIGS. 21, 22a, 22b, 22c, 23 and 24 and was fabricated without the p-electrode pads 255

Here, the graph of FIG. 33 shows operating voltage drop of the light emitting diode upon annealing, in which the first Ni layer 253a and the second Ni layer 253c of the ohmic layer of the electrode extensions 253 or the n-electrode pads 251 and the electrode extensions 253 include Ni layers, that is, in which the ohmic layer includes a Ni layer/Al layer/Ni layer/Au layer.

Here, the expression "immediately after deposition" means operating voltage of the light emitting diode before annealing of the light emitting diode after deposition of the ohmic layer including the Ni layer/Al layer/Ni layer, the expression "1.5 hours after annealing" means operating voltage of the light emitting diode 1.5 hours after annealing of the light emitting diode, and the expression "3 hours after annealing" means operating voltage of the light emitting diode 3 hours after annealing of the light emitting diode.

In the graph of FIG. 33, when the light emitting diode having the ohmic layer including the Ni layer/Al layer/Ni layer was subjected to annealing, the operating voltage of the light emitting diode was reduced after annealing, and exhibited substantially no variation in operating voltage over time after annealing.

Figure 34A:
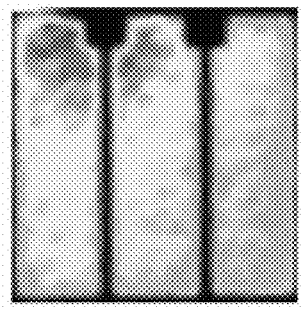
FIGS. 34a and 34b are pictures showing uniform light emission when n-electrode pads or pad layers of electrode extensions were thickly formed.
Figure 34B:
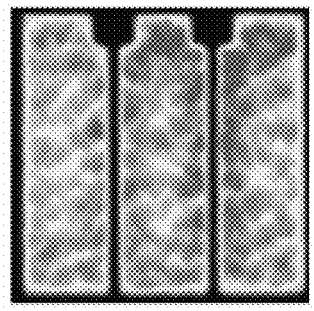

FIGS. 34a and 34b are pictures showing uniform light emission when n-electrode pads or pad layers of electrode extensions were thickly formed.

The pictures of FIGS. 34a and 34b show the light emitting diode, which had a structure similar to that of described with reference to FIGS. 21, 22a, 22b, 22c, 23 and 24 and was fabricated without the p-electrode pads 255. Here, FIG. 34a shows a luminous pattern of the light emitting diode (Comparative Example), in which the pad layer was composed only of a 5250 Å thick Au layer, and FIG. 34b shows a luminous pattern of the light emitting diode (Example), in which the pad layer was composed of an Au layer/Cr layer/Au layer, and a total thickness of the Au layers was 4 µm.

In FIGS. 34a and 34b, it can be seen that the light emitting diode of Example had a more uniform luminous pattern than the light emitting diode of Comparative Example. It was understood that, when the total thickness of the Au layers of the pad layer of the n-electrode pads or the electrode extensions was increased to 4 µm as in Example, resistance of the n-electrode pads or the electrode extensions was decreased to allow uniform dispersion of current in a horizontal direction of the electrode extensions, preferably in a longitudinal direction of the electrode extensions, thereby improving current spreading.

Although some embodiments and features have been described herein, it should be understood by those skilled in the art that the present invention is not limited to the above embodiments and features thereof, and that various modifications, variations, and alterations can be made without departing from the spirit and scope of the invention. In addition, it should be understood that some features of a certain embodiment may also be applied to other embodiments without departing from the spirit and scope of the invention.

What is claimed is:

1. A light-emitting diode, comprising:
a support substrate;
a semiconductor stack disposed on the support substrate, the semiconductor stack comprising a p-type compound semiconductor layer, an active layer, and an n-type compound semiconductor layer;
a reflective metal layer disposed between the support substrate and the semiconductor stack, the reflective metal layer being in ohmic contact with the p-type compound semiconductor layer of the semiconductor stack and comprising a groove exposing a portion of the semiconductor stack;
an insulation layer disposed between the support substrate and the semiconductor stack, the insulation layer disposed in the groove; and
a first electrode comprising a first electrode pad and a first electrode extension, the first electrode contacting the n-type compound semiconductor layer of the semiconductor stack,
wherein:
the first electrode extension is connected to the first electrode pad;
the first electrode extension is formed along an outer boundary of the light-emitting diode; and
the first electrode extension comprises a Ni layer contacting the n-type compound semiconductor layer and at least two Au layers disposed on the Ni layer.

2. The light-emitting diode of claim 1, wherein the insulation layer overlaps at least one of the first electrode pad and the first electrode extension.

3. The light-emitting diode of claim 2, wherein the first electrode pad and the first electrode extension do not overlap the reflective metal layer.

4. The light-emitting diode of claim 1, wherein the first electrode further comprises a second electrode extension formed substantially parallel to a portion of the first electrode extension and connected to the first electrode pad.

5. The light-emitting diode of claim 4, wherein:
the insulation layer is further formed on an outer end of the semiconductor stack; and
the first electrode extension and the second electrode extension overlap the insulation layer.

6. The light-emitting diode of claim 1, wherein the first electrode pad and the first electrode extension overlap the insulation layer.

7. A light-emitting diode, comprising:
a support substrate;
a semiconductor stack disposed on the support substrate, the semiconductor stack comprising a p-type compound semiconductor layer, an active layer, and an n-type compound semiconductor layer;
a reflective metal layer disposed between the support substrate and the semiconductor stack, the reflective metal layer being in ohmic contact with the p-type compound semiconductor layer of the semiconductor stack and comprising a groove exposing a portion of the semiconductor stack;
an insulation layer disposed between the support substrate and the semiconductor stack, the insulation layer disposed in the groove; and
a first electrode comprising a first electrode pad and a first electrode extension, the first electrode contacting the n-type compound semiconductor layer of the semiconductor stack,
wherein:
the first electrode extension is connected to the first electrode pad;
the first electrode extension is formed along an outer boundary of the light-emitting diode:
a top surface of the n-type compound semiconductor layer comprises a roughened surface and a flat surface; and
the first electrode pad is disposed on the flat surface of the n-type compound semiconductor layer.

8. The light-emitting diode of claim 4, wherein the first electrode extension is disposed on the flat surface of the n-type compound semiconductor layer.

9. A light-emitting diode, comprising:
a support substrate;
a semiconductor stack disposed on the support substrate, the semiconductor stack comprising a p-type compound semiconductor layer, an active layer, and an n-type compound semiconductor layer;
a reflective metal layer disposed between the support substrate and the semiconductor stack, the reflective metal layer being in ohmic contact with the p-type compound semiconductor layer of the semiconductor stack and comprising a groove exposing a portion of the semiconductor stack;
an insulation layer disposed between the support substrate and the semiconductor stack, the insulation layer disposed in the groove and on an outer end of the semiconductor stack; and
a first electrode comprising a first electrode pad and an electrode extension, the first electrode contacting the n-type compound semiconductor layer of the semiconductor stack,
wherein the first electrode pad and the electrode extension overlap the insulation layer, and
wherein a top surface of the n-type compound semiconductor layer comprises a roughened surface and a flat surface.

10. The light-emitting diode of claim 9, wherein the first electrode pad and the electrode extension are disposed on the flat surface of the n-type compound semiconductor layer.

11. The light-emitting diode of claim 10, wherein the first electrode pad and the electrode extension do not overlap the reflective metal layer.

12. The light-emitting diode of claim 11, wherein the electrode extension is connected to the first electrode pad and is formed along an outer boundary of the light-emitting diode.

13. A light-emitting diode, comprising:
a support substrate;
a semiconductor stack disposed on the support substrate, the semiconductor stack comprising a p-type compound semiconductor layer, an active layer, and an n-type compound semiconductor layer;
a reflective metal layer disposed between the support substrate and the semiconductor stack, the reflective metal layer being in ohmic contact with the p-type compound semiconductor layer of the semiconductor stack and comprising a groove exposing a portion of the semiconductor stack;
an insulation layer disposed between the support substrate and the semiconductor stack, the insulation layer disposed in the groove and on an outer end of the semiconductor stack; and
a first electrode comprising a first electrode pad and an electrode extension, the first electrode contacting the n-type compound semiconductor layer of the semiconductor stack,
wherein the first electrode pad and the electrode extension overlap the insulation layer, and
wherein the electrode extension comprises a Ni layer contacting the n-type compound semiconductor layer, and at least two Au layers disposed on the Ni layer.

14. A light-emitting diode, comprising:
a support substrate;
a semiconductor stack disposed on the support substrate, the semiconductor stack comprising a p-type compound semiconductor layer, an active layer, and an n-type compound semiconductor layer;
a reflective metal layer disposed between the support substrate and the semiconductor stack, the reflective metal layer being in ohmic contact with the p-type compound semiconductor layer of the semiconductor stack and comprising a groove exposing a portion of the semiconductor stack;
an insulation layer disposed between the support substrate and the semiconductor stack; and
a first electrode comprising a first electrode pad and an electrode extension connected to the first electrode pad, wherein:
a top surface of the n-type compound semiconductor layer comprises a roughened surface and a flat surface; and
the first electrode pad and the electrode extension are disposed on the flat surface of the n-type compound semiconductor layer.

15. The light-emitting diode of claim 14, wherein the electrode extension comprises:
a Ni layer contacting the n-type compound semiconductor layer; and
at least two Au layers disposed on the Ni layer.

16. The light-emitting diode of claim 14, wherein the insulation layer is disposed in the groove and on an outer boundary of the semiconductor stack.

17. The light-emitting diode of claim 16, wherein the first electrode pad and the electrode extension each overlap the insulation layer.

* * * * *